United States Patent
Wan et al.

(10) Patent No.: US 9,425,233 B2
(45) Date of Patent: Aug. 23, 2016

(54) RGBZ PIXEL CELL UNIT FOR AN RGBZ IMAGE SENSOR

(71) Applicant: Google Inc., Mountain View, CA (US)

(72) Inventors: Chung Chun Wan, Fremont, CA (US); Boyd Fowler, Sunnyvale, CA (US)

(73) Assignee: GOOGLE INC., Mountain View, CA (US)

( * ) Notice: Subject to any disclaimer, the term of this patent is extended or adjusted under 35 U.S.C. 154(b) by 0 days.

(21) Appl. No.: 14/579,988

(22) Filed: Dec. 22, 2014

(65) Prior Publication Data

US 2016/0181295 A1  Jun. 23, 2016

(51) Int. Cl.
| | |
|---|---|
| H01L 31/062 | (2012.01) |
| H01L 31/113 | (2006.01) |
| H01L 27/146 | (2006.01) |
| H04N 5/33 | (2006.01) |
| H04N 5/378 | (2011.01) |
| H04N 5/374 | (2011.01) |

(52) U.S. Cl.
CPC ...... *H01L 27/1465* (2013.01); *H01L 27/14612* (2013.01); *H04N 5/33* (2013.01); *H04N 5/332* (2013.01); *H04N 5/378* (2013.01); *H04N 5/3742* (2013.01)

(58) Field of Classification Search
USPC ........... 257/81, 82, 91, 98, 99, 100, 116, 117, 257/432–437, 749, E33.056–E33.059, 257/E25.032; 438/25–28
See application file for complete search history.

(56) References Cited

U.S. PATENT DOCUMENTS

| | | | |
|---|---|---|---|
| 7,274,393 B2 * | 9/2007 | Acharya | H04N 5/33 250/226 |
| 7,375,803 B1 | 5/2008 | Bamji | |
| 7,560,679 B1 | 7/2009 | Gutierrez | |
| 7,773,138 B2 | 8/2010 | Lahav et al. | |
| 7,859,581 B2 | 12/2010 | Guidash | |
| 7,936,038 B2 | 5/2011 | Jeong et al. | |

(Continued)

FOREIGN PATENT DOCUMENTS

WO   WO-2013/104718   7/2013

OTHER PUBLICATIONS

Kim, Winjoo , "A 1.5Mpixel RGBZ CMOS Image Sensor for Simultaneous Color and Range Image Capture", *IEEE International Solid-State Circuits Conference, Digital Technical Papers*, ISSCC2012/Session22/Image Sensors/22.7, (Feb. 2012), 392-393.

(Continued)

*Primary Examiner* — Dao H Nguyen
*Assistant Examiner* — Tram H Nguyen
(74) *Attorney, Agent, or Firm* — Blakely Sokoloff Taylor Zafman LLP

(57) ABSTRACT

An image sensor is described. The image sensor includes a pixel array having a unit cell that includes visible light photodiodes and an infra-red photodiode. The visible light photodiodes and the infra-red photodiode are coupled to a particular column of the pixel array. The unit cell has a first capacitor coupled to the visible light photodiodes to store charge from each of the visible light photodiodes. The unit cell having a readout circuit to provide the first capacitor's voltage on the particular column. The unit cell having a second capacitor that is coupled to the infra-red photodiode through a transfer gate transistor to receive charge from the infra-red photodiode during a time-of-flight exposure. The unit cell has a back-drain transistor coupled to the infra-red photodiode.

25 Claims, 24 Drawing Sheets

(56) References Cited

U.S. PATENT DOCUMENTS

| | | | |
|---|---|---|---|
| 7,990,636 B2 | 8/2011 | Park et al. | |
| 8,027,107 B2 | 9/2011 | Hwang et al. | |
| 8,116,018 B2 | 2/2012 | Park et al. | |
| 8,139,142 B2 | 3/2012 | Bamji et al. | |
| 8,159,762 B2 | 4/2012 | Lim et al. | |
| 8,218,016 B2 | 7/2012 | Park et al. | |
| 8,228,410 B2 | 7/2012 | Raynor et al. | |
| 8,542,348 B2 | 9/2013 | Hardegger et al. | |
| 8,675,181 B2 | 3/2014 | Hall | |
| 8,785,982 B2 * | 7/2014 | Kim | H01L 27/14609 257/212 |
| 2003/0063185 A1 * | 4/2003 | Bell | G01S 17/023 348/46 |
| 2007/0075627 A1 * | 4/2007 | Kimura | H01L 27/3213 312/503 |
| 2011/0001205 A1 | 1/2011 | Sul et al. | |
| 2011/0194007 A1 | 8/2011 | Kim et al. | |
| 2012/0133891 A1 | 5/2012 | Jiang | |
| 2012/0236121 A1 * | 9/2012 | Park | H04N 13/0271 348/46 |
| 2013/0002118 A1 * | 1/2013 | Ko | H01L 27/3216 313/1 |
| 2013/0020463 A1 | 1/2013 | Lee et al. | |
| 2013/0026859 A1 | 1/2013 | Bae et al. | |
| 2013/0120623 A1 | 5/2013 | Kim | |
| 2013/0134470 A1 | 5/2013 | Shin et al. | |
| 2013/0181119 A1 | 7/2013 | Bikumandla et al. | |
| 2014/0007838 A1 | 1/2014 | Archer | |
| 2014/0217474 A1 | 8/2014 | Lee et al. | |
| 2014/0332665 A1 | 11/2014 | Jiang et al. | |
| 2014/0347442 A1 | 11/2014 | Wang et al. | |
| 2015/0138178 A1 * | 5/2015 | Woo | G09G 3/3233 345/212 |
| 2015/0379924 A1 * | 12/2015 | Matsueda | G09G 3/3208 345/690 |
| 2016/0020174 A1 * | 1/2016 | Kim | H01L 27/156 257/89 |

OTHER PUBLICATIONS

Kim, Seong-Jin, et al., "A 640×480 Image Sensor With Unified Pixel Architecture for 2D/3D Imaging in 0.1um CMOS", *Proceedings of IEEE Symposium on VLSI Circuits Digest of Technical Papers*, New York, (2011), 92-93.

Kim, Seong-Jin, et al., "A CMOS Image Sensor Based on Unified Pixel Architecture With Time-Division Multiplexing Scheme for Color and Depth Image Acquisition", *IEEE Journal of Solid-State Circuits*, vol. 47, No. 11, (Nov. 2012), 2834-2845.

PCT/US2015/062151—International Search Report and Written Opinion, issued Apr. 12, 2016, 9 pages.

* cited by examiner

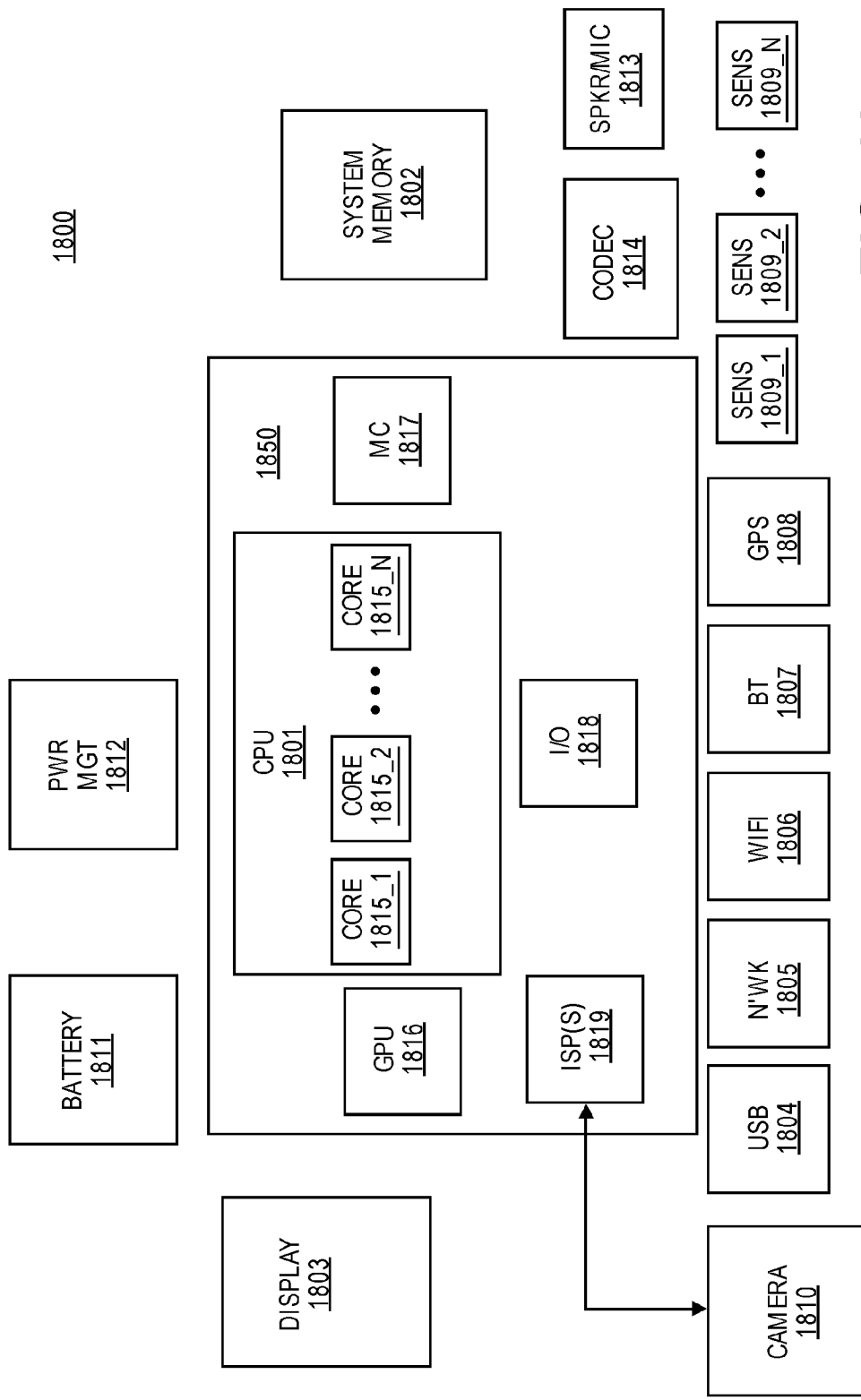

US 9,425,233 B2

RGBZ PIXEL CELL UNIT FOR AN RGBZ IMAGE SENSOR

FIELD OF INVENTION

The field of invention pertains generally to imaging technology, and, more specifically, to an RGBZ pixel unit cell for an RGBZ image sensor.

BACKGROUND

Figure 1:
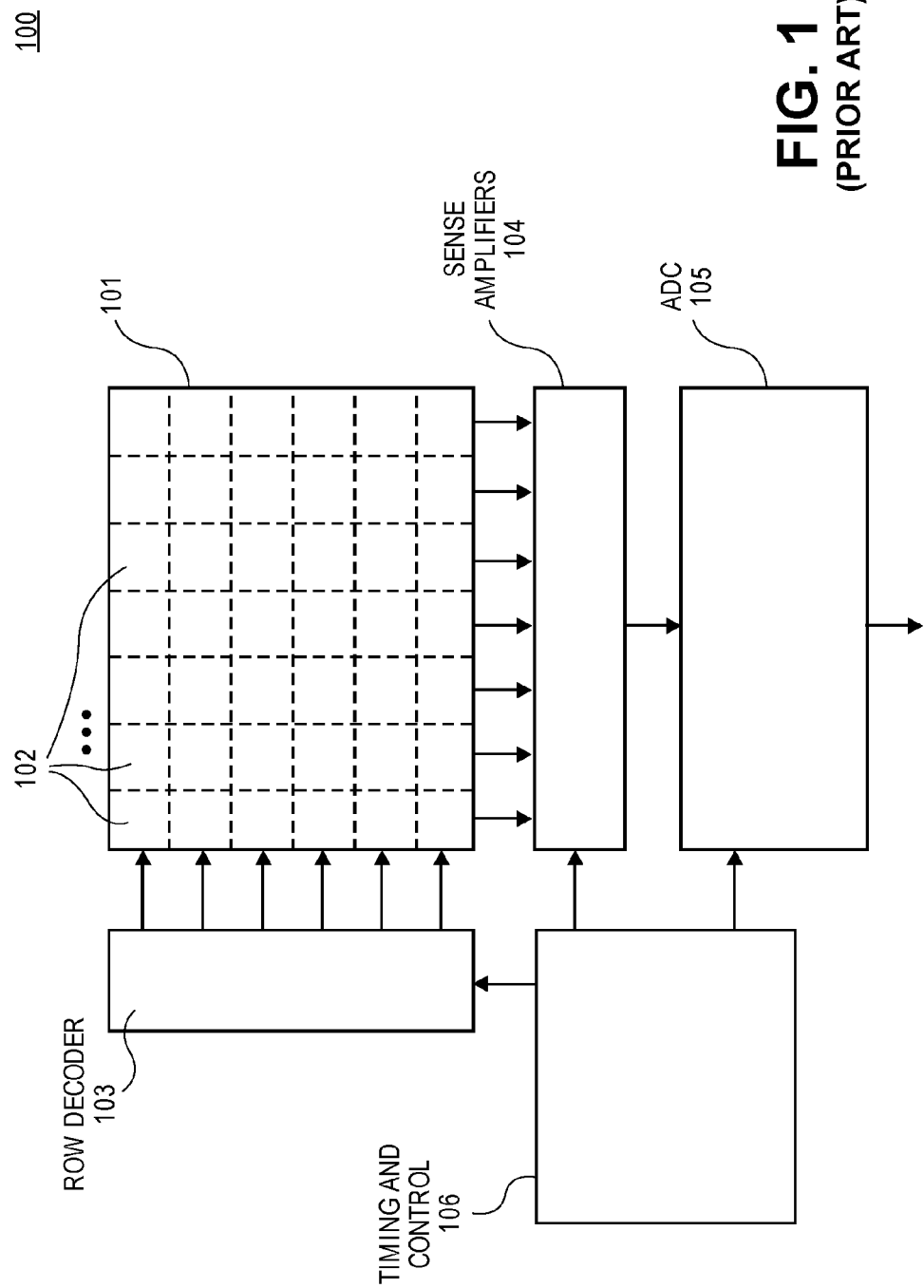

FIG. 1 shows the basic elements of an image sensor 100. As observed in FIG. 1, the image sensor includes a pixel array 101 having constituent pixel cells 102. Coupled to the pixel array 101 is a row decoder 103 having outputs that couple to rows of pixel cells 102. Sense amplifiers 104 are also coupled to the pixel array 101 column outputs. The image sensor 100 also includes analog-to-digital circuitry 105 coupled downstream from the sense amplifiers 104. The image sensor 100 also includes timing and control circuitry 106 that is responsible for generating clock and control signals that dictate the operation of the image sensor 100.

SUMMARY

An image sensor is described. The image sensor includes a pixel array having a unit cell that includes visible light photodiodes and an infra-red photodiode. The visible light photodiodes and the infra-red photodiode are coupled to a particular column of the pixel array. The unit cell has a first capacitor coupled to the visible light photodiodes to store charge from each of the visible light photodiodes. The unit cell having a readout circuit to provide the first capacitor's voltage on the particular column. The unit cell having a second capacitor that is coupled to the infra-red photodiode through a transfer gate transistor to receive charge from the infra-red photodiode during a time-of-flight exposure. The unit cell has a back-drain transistor coupled to the infra-red photodiode.

An apparatus is described having first means for transferring first charge from a first photodiode that has received visible light of a first type into a storage capacitor and reading out a first voltage of the storage capacitor at a pixel array column. The apparatus also has second means for transferring second charge from a second photodiode that has received visible light of a second type into the storage capacitor and reading out a second voltage of the storage capacitor at the pixel array column. The apparatus also has third means for transferring third charge from a third photodiode that has received visible light of a third type into the storage capacitor and reading out a third voltage of the storage capacitor at the pixel array column. The apparatus also has fourth means for transferring fourth charge from a fourth photodiode that has received infra red light during a time-of-flight exposure into a second storage capacitor and reading out a fourth voltage of the second storage capacitor at the pixel array column.

FIGURES

Figure 2:
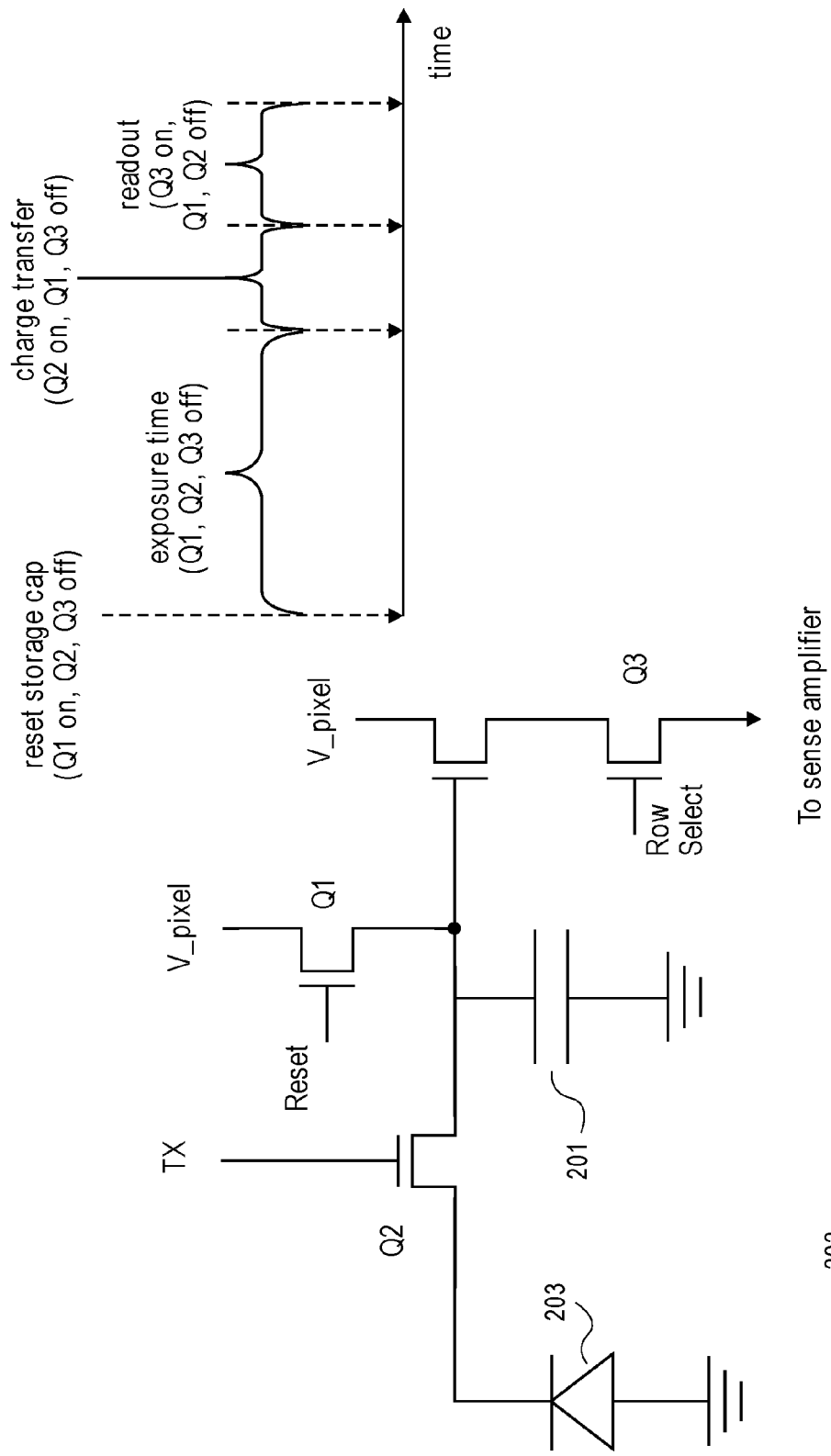
Figure 3:
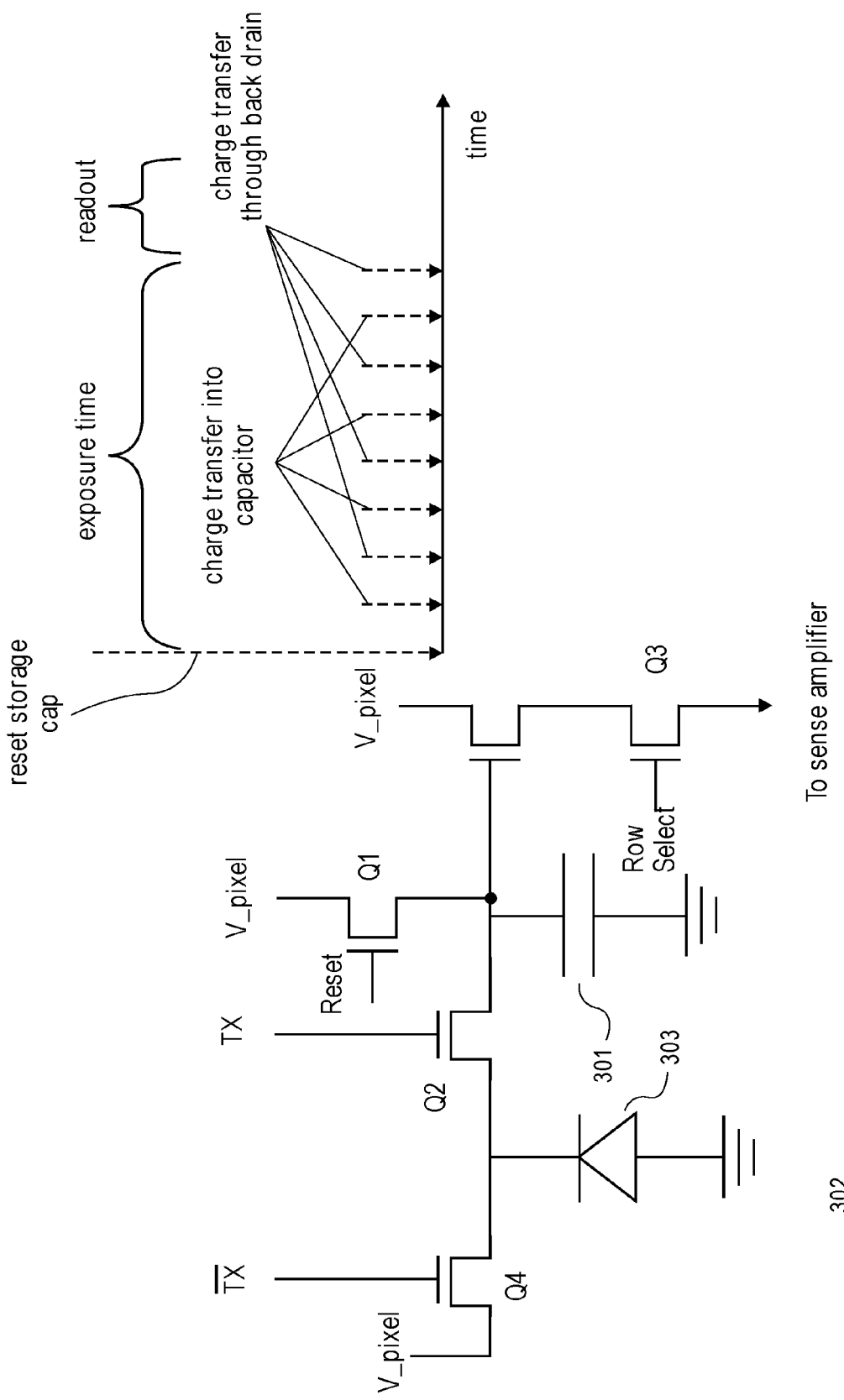
Figure 4:
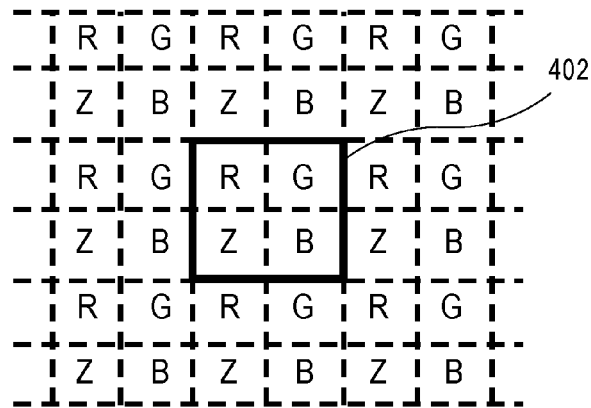
Figure 5:
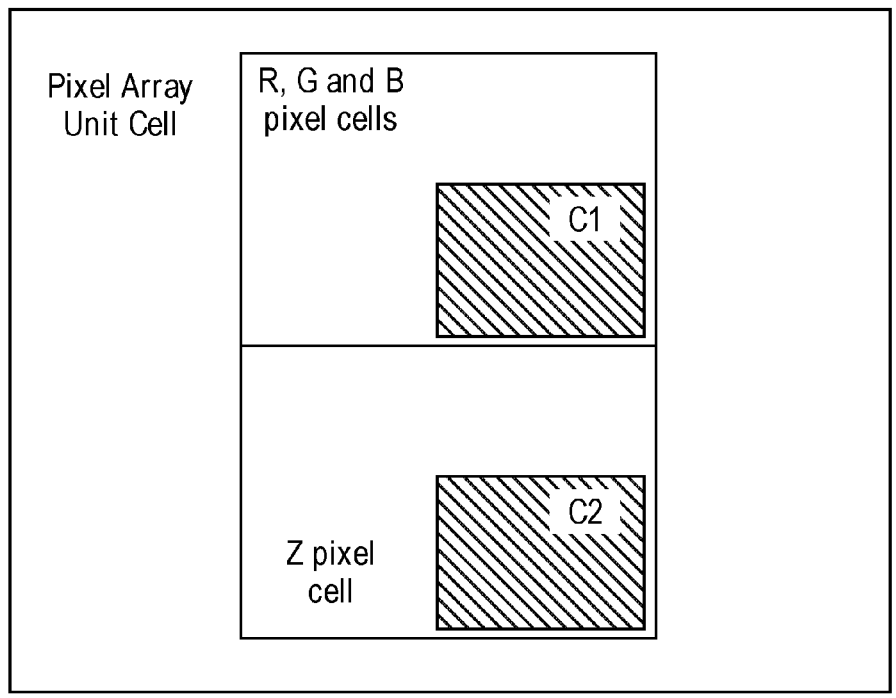
Figure 6:
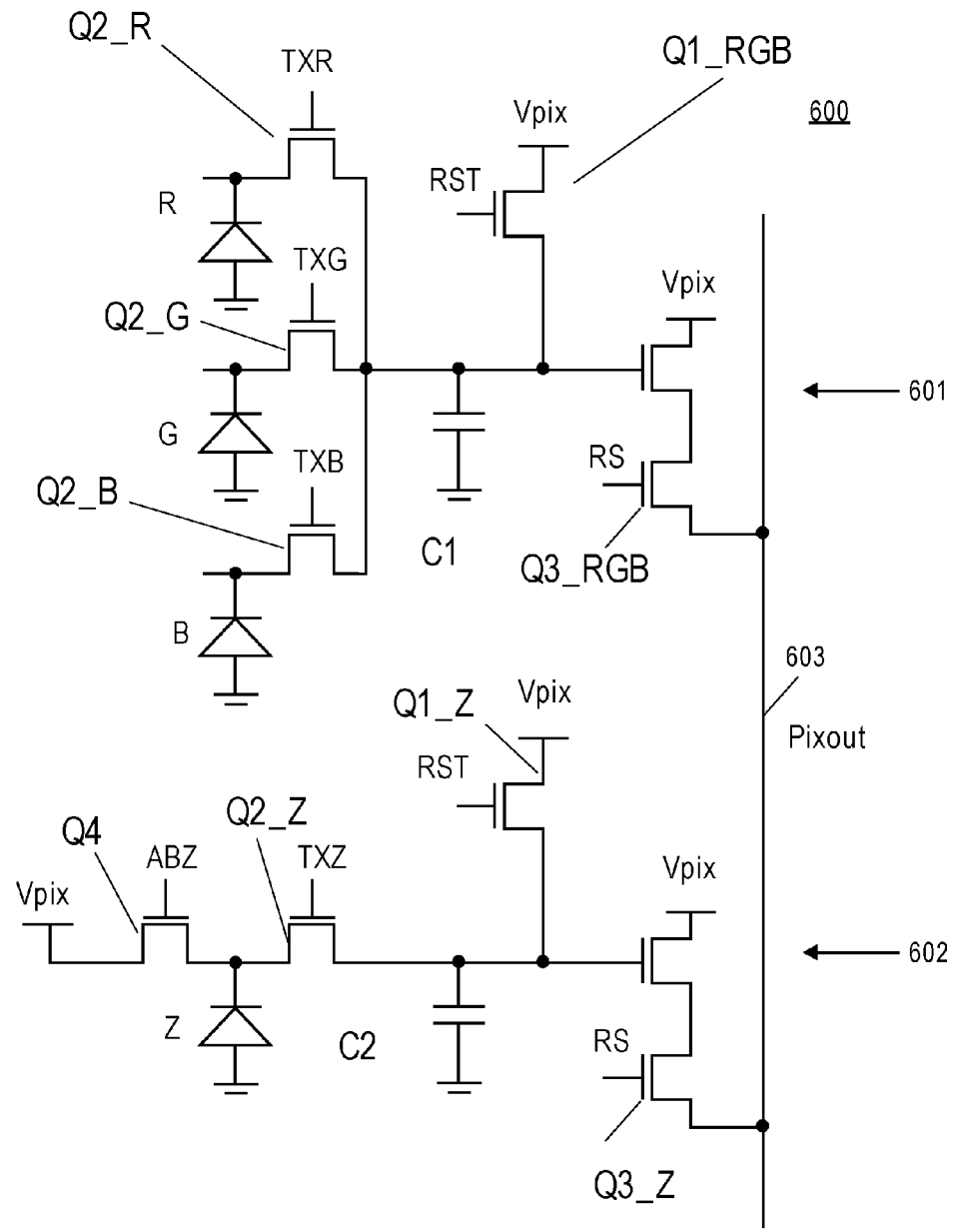
Figure 7A:
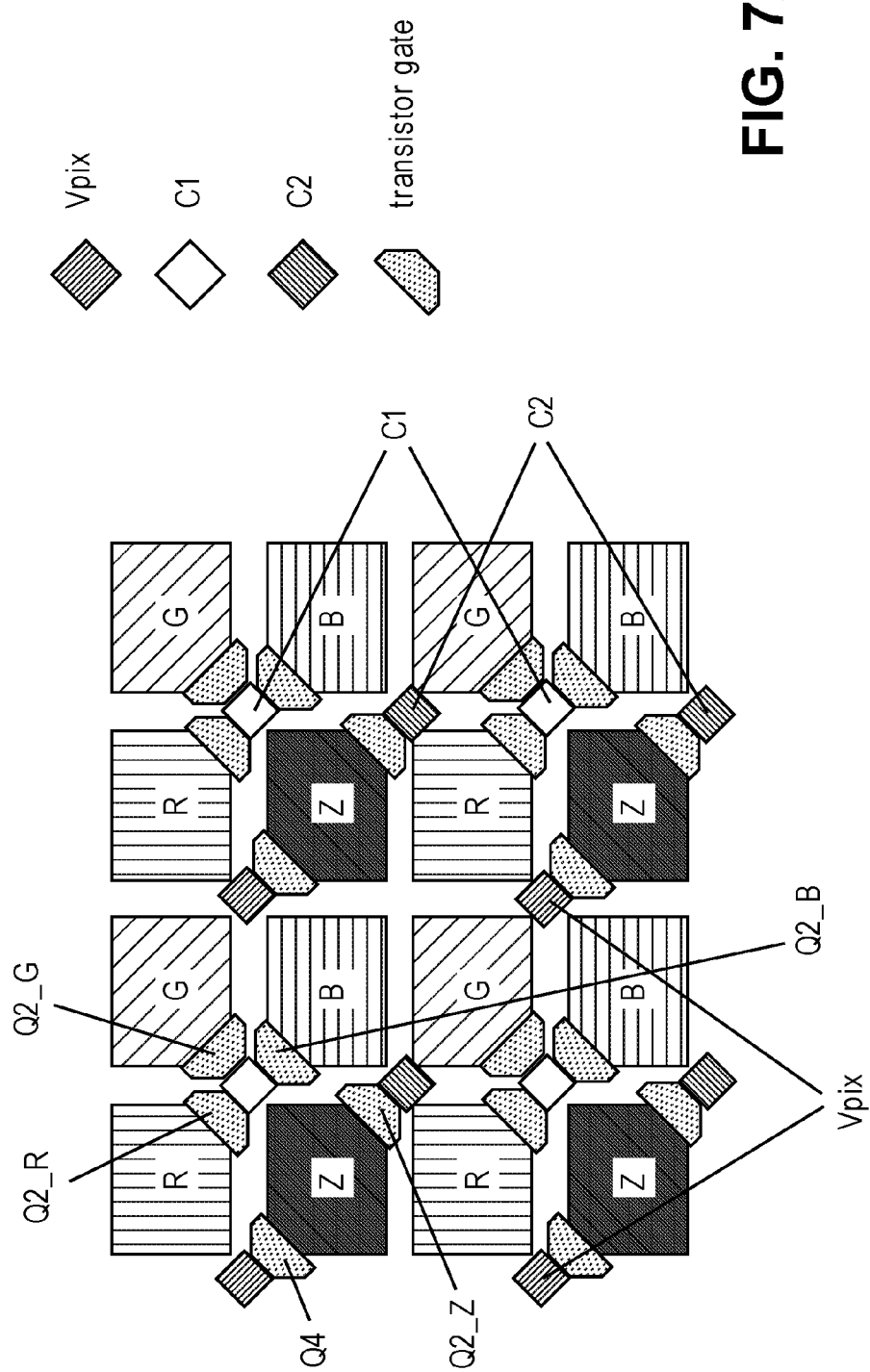
Figure 7B:
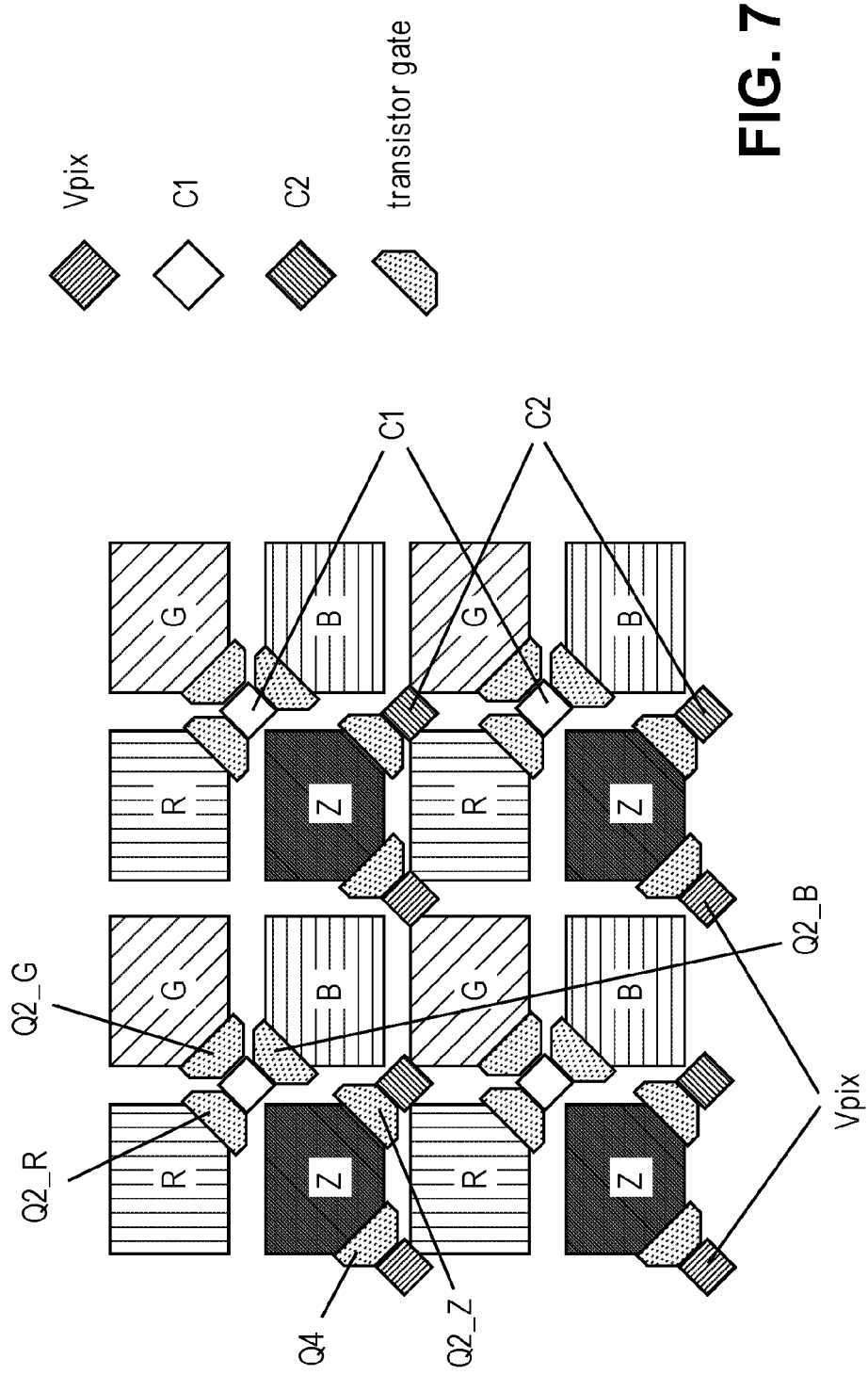
Figure 8:
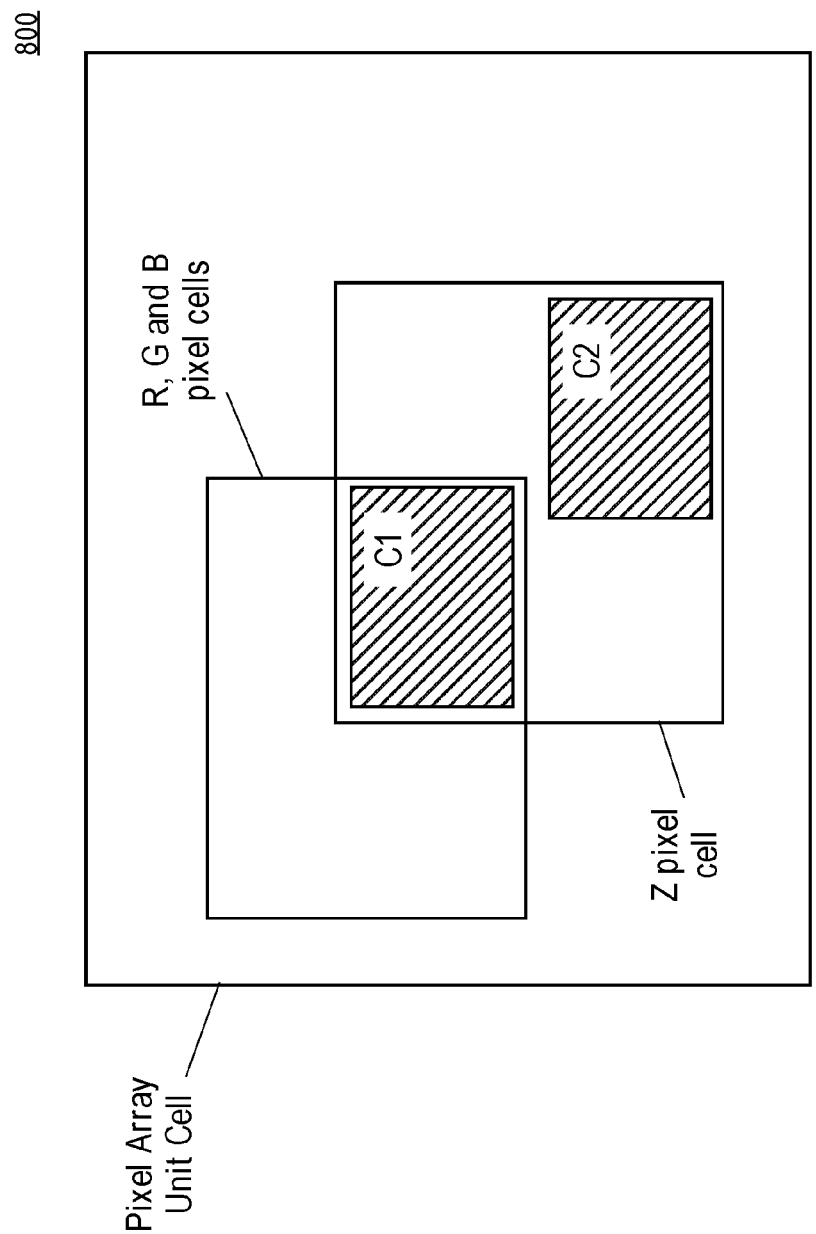
Figure 9:
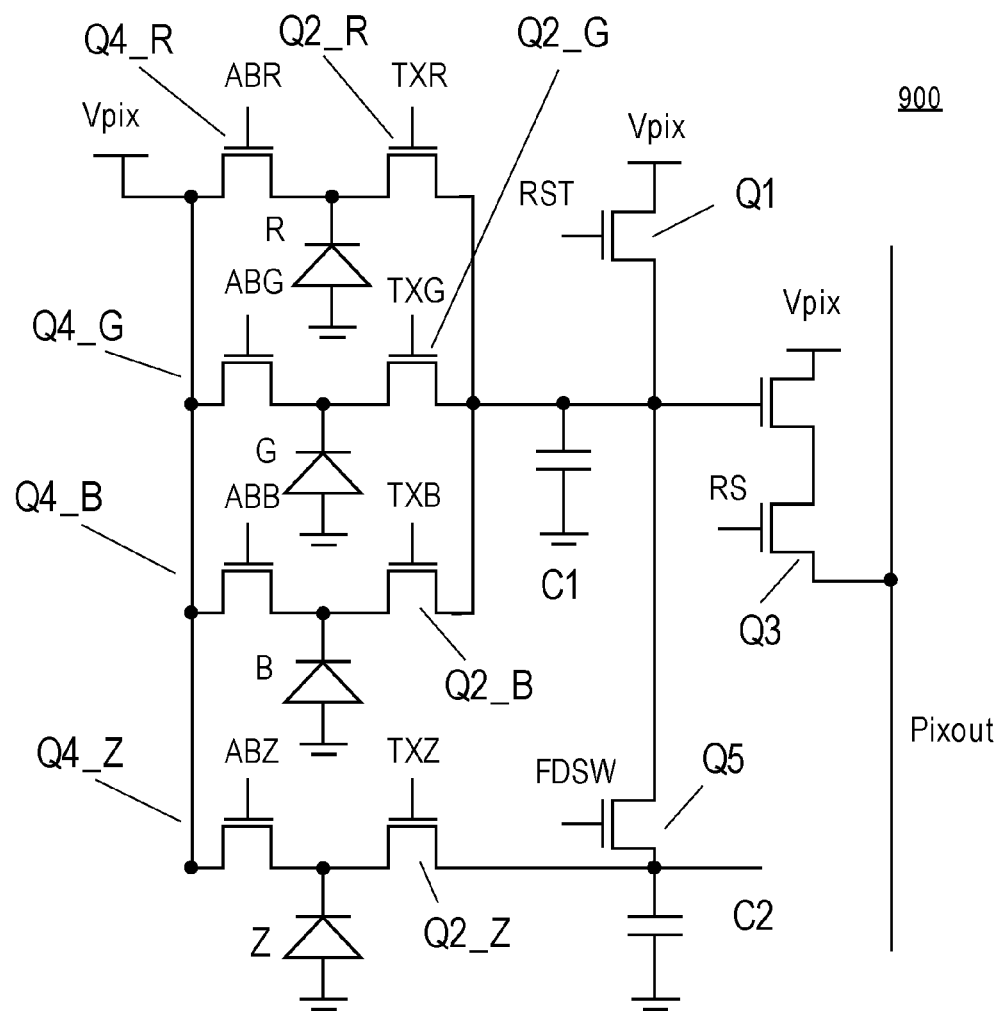
Figure 10A:
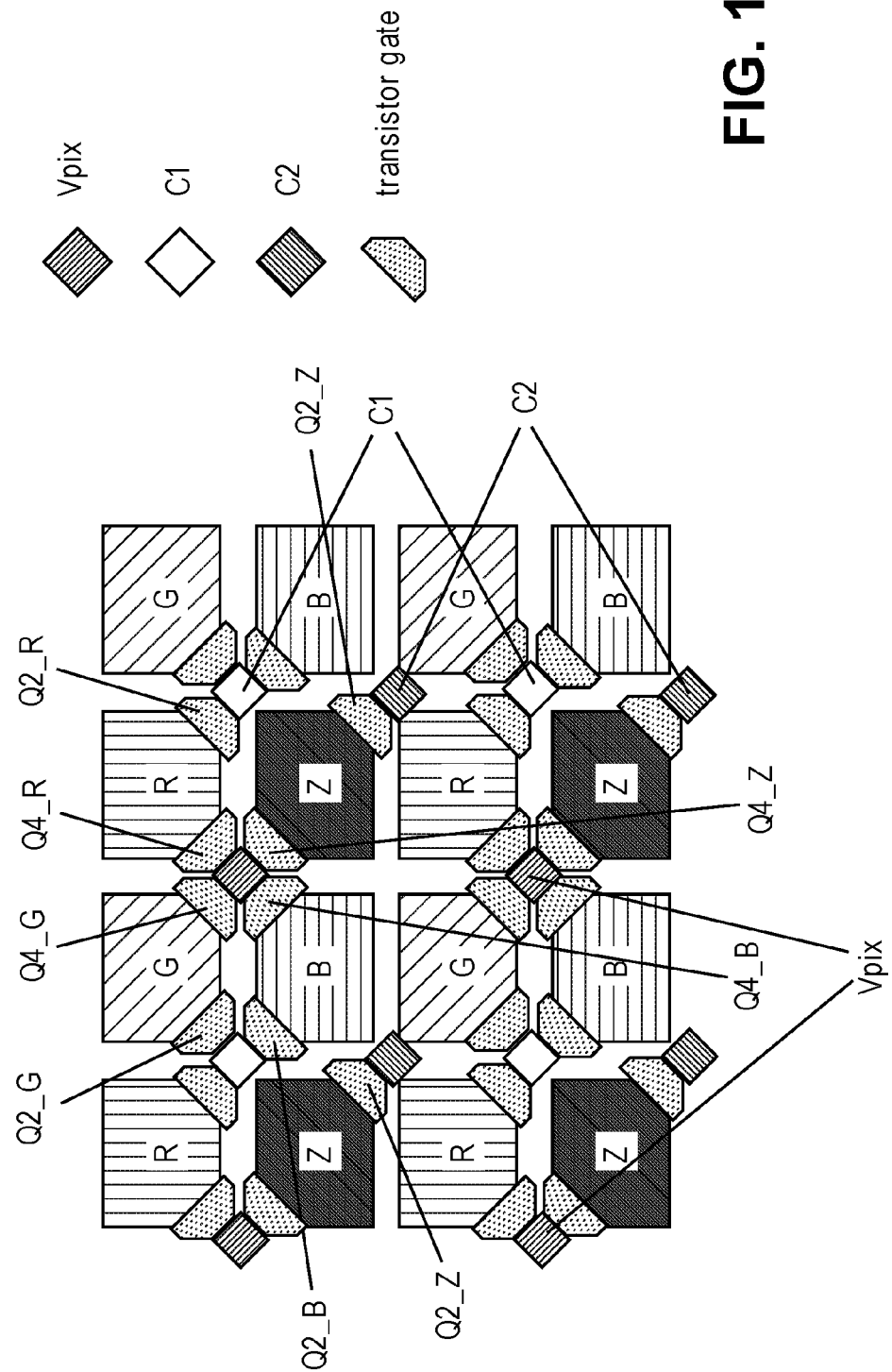
Figure 10B:
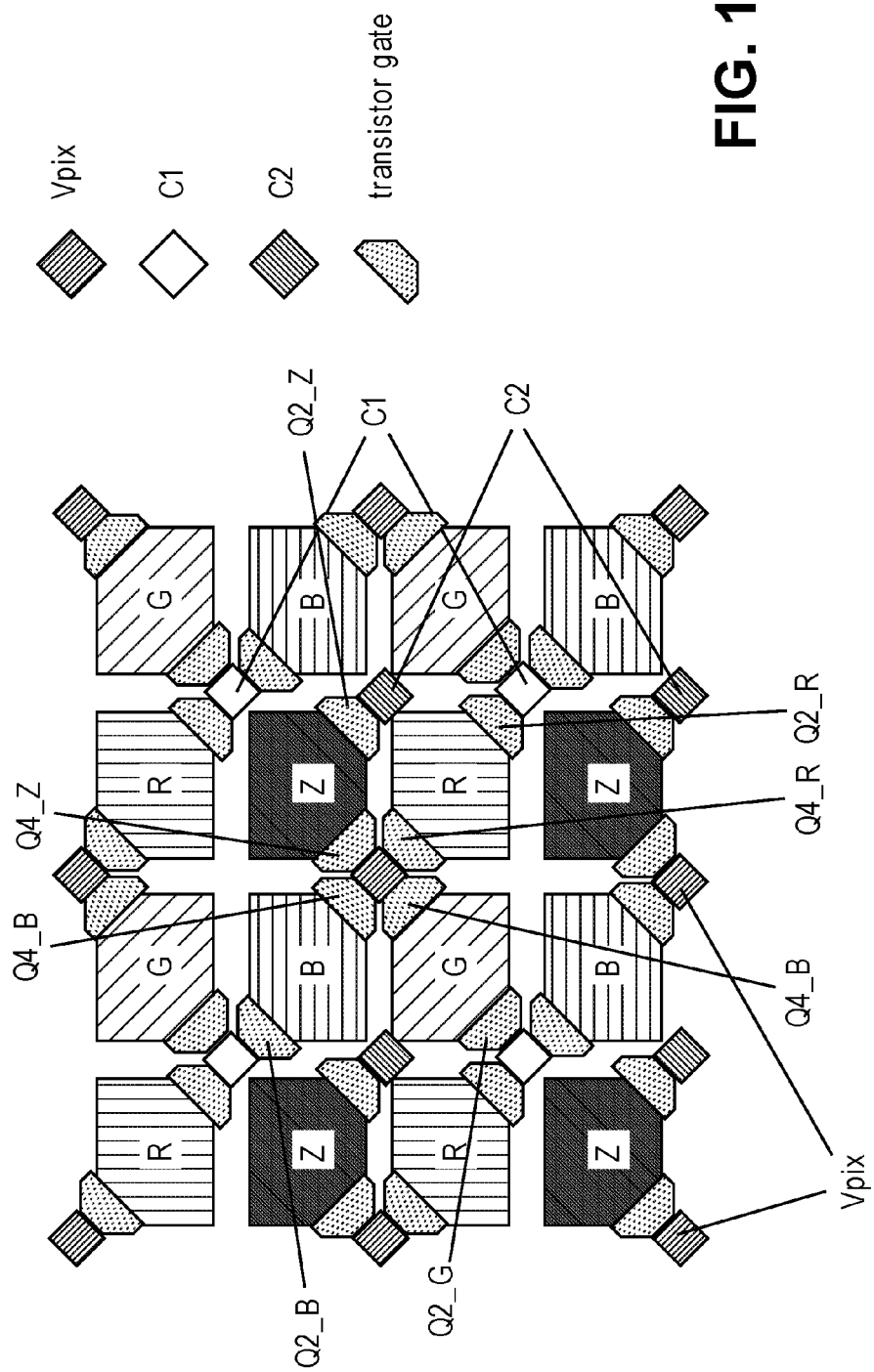
Figure 11:
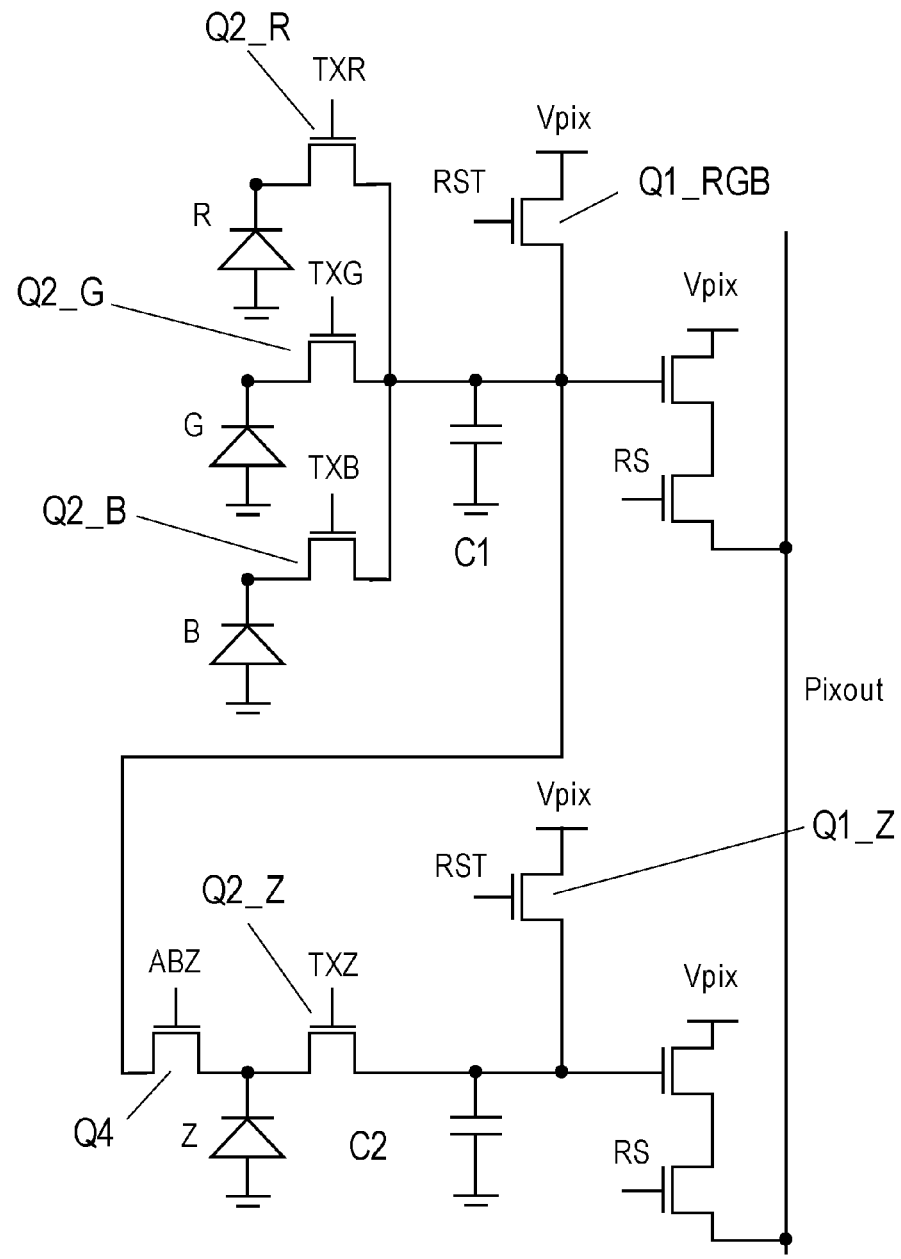
Figure 12A:
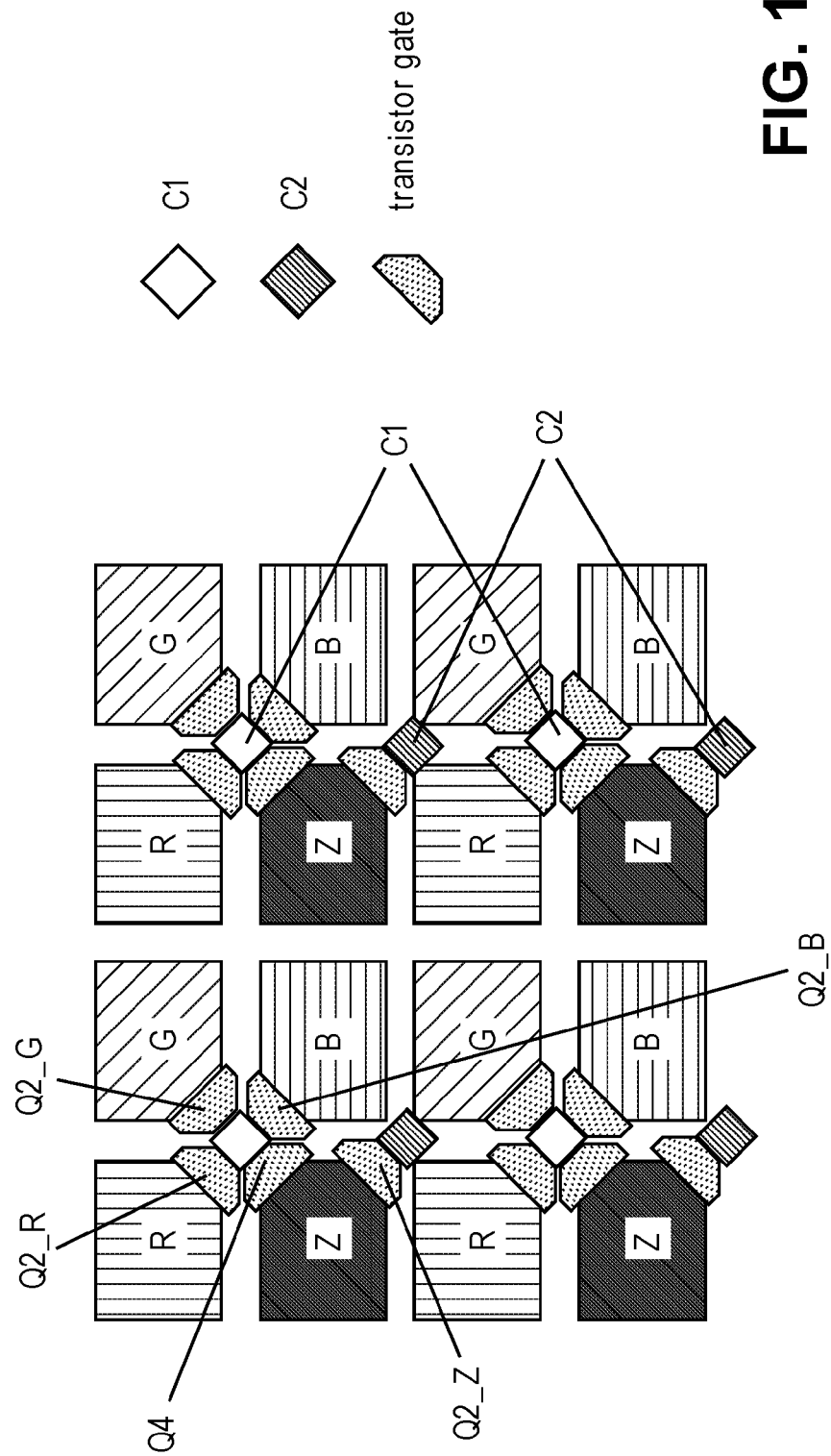
Figure 12B:
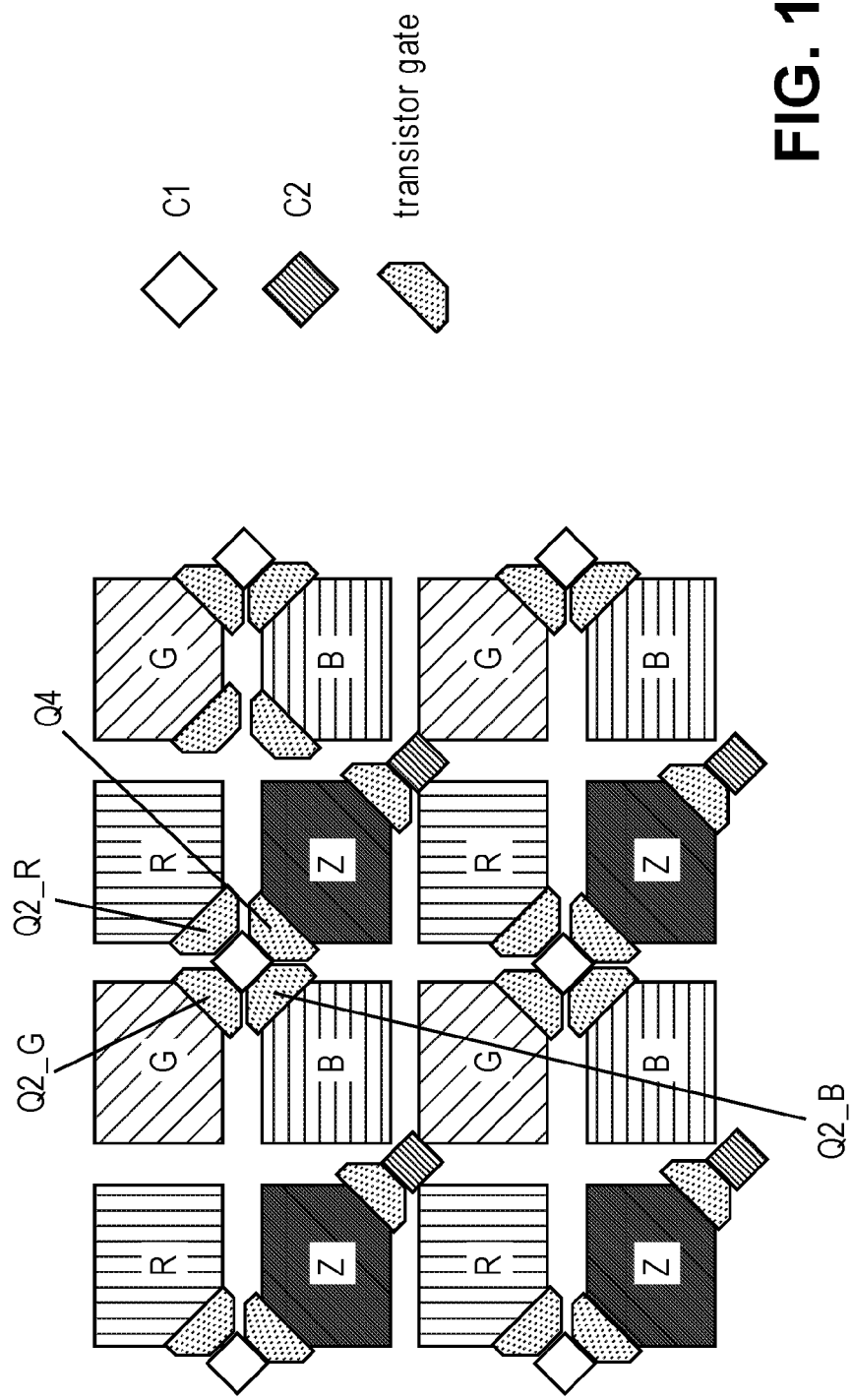
Figure 13:
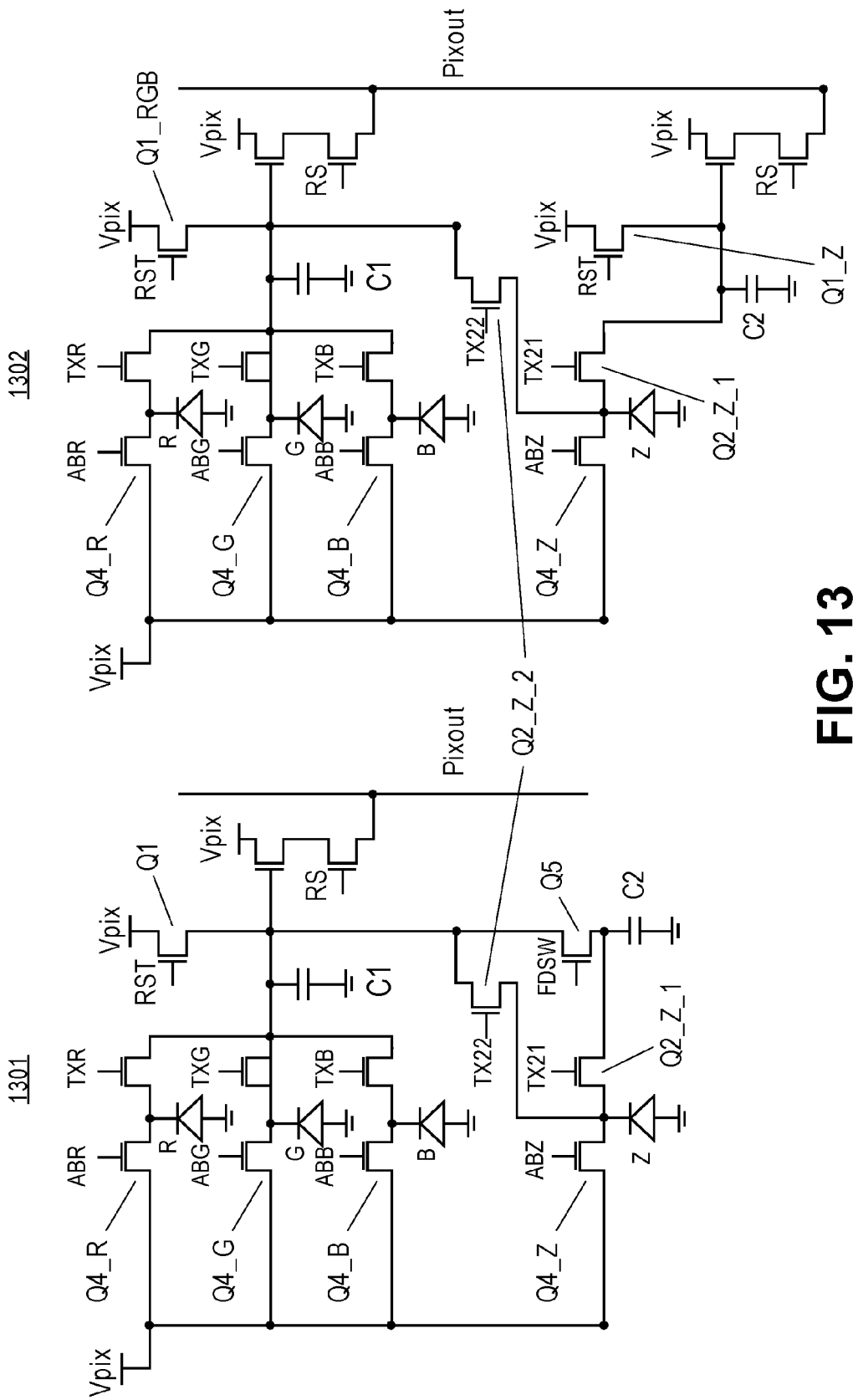
Figure 14A:
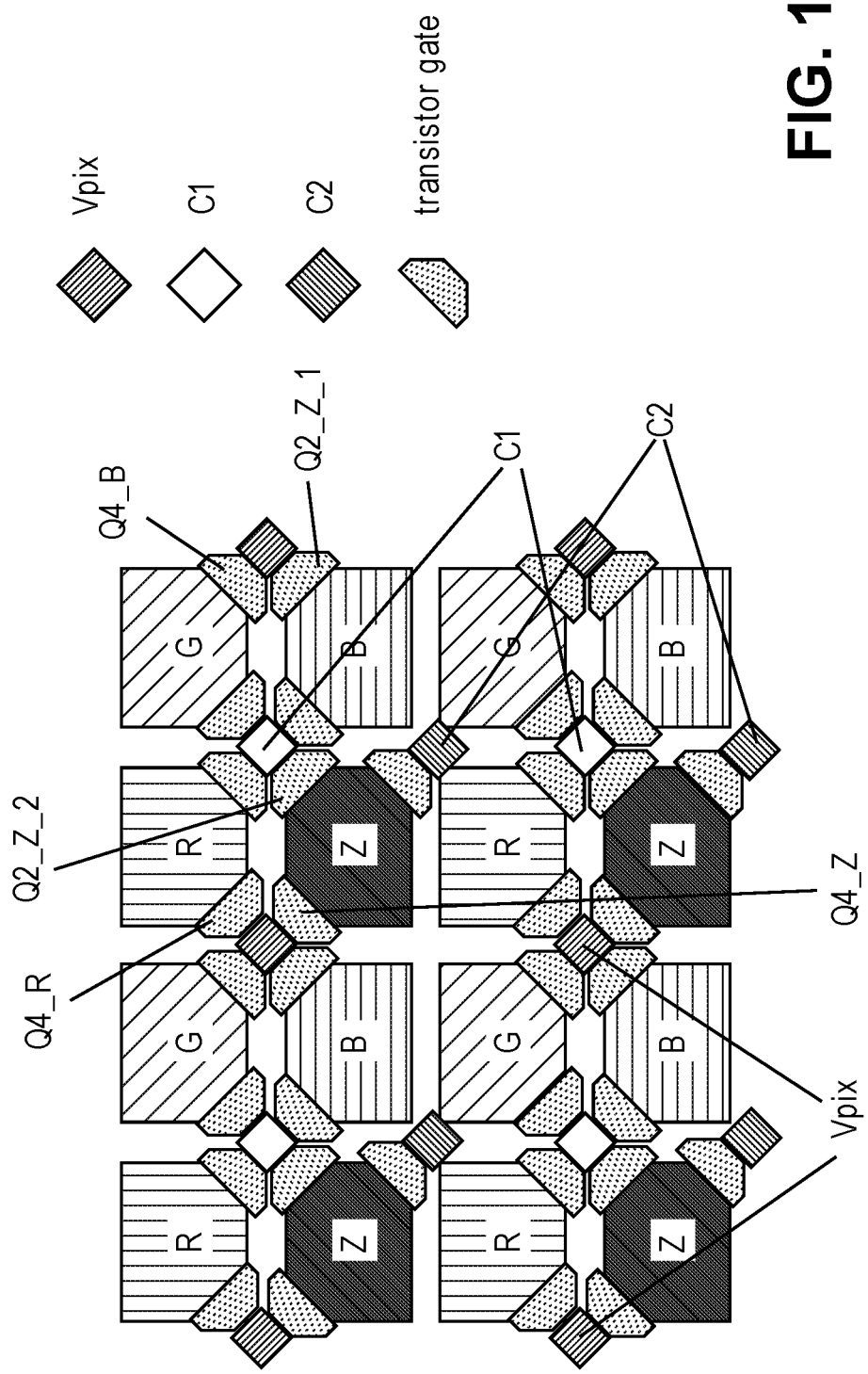
Figure 14B:
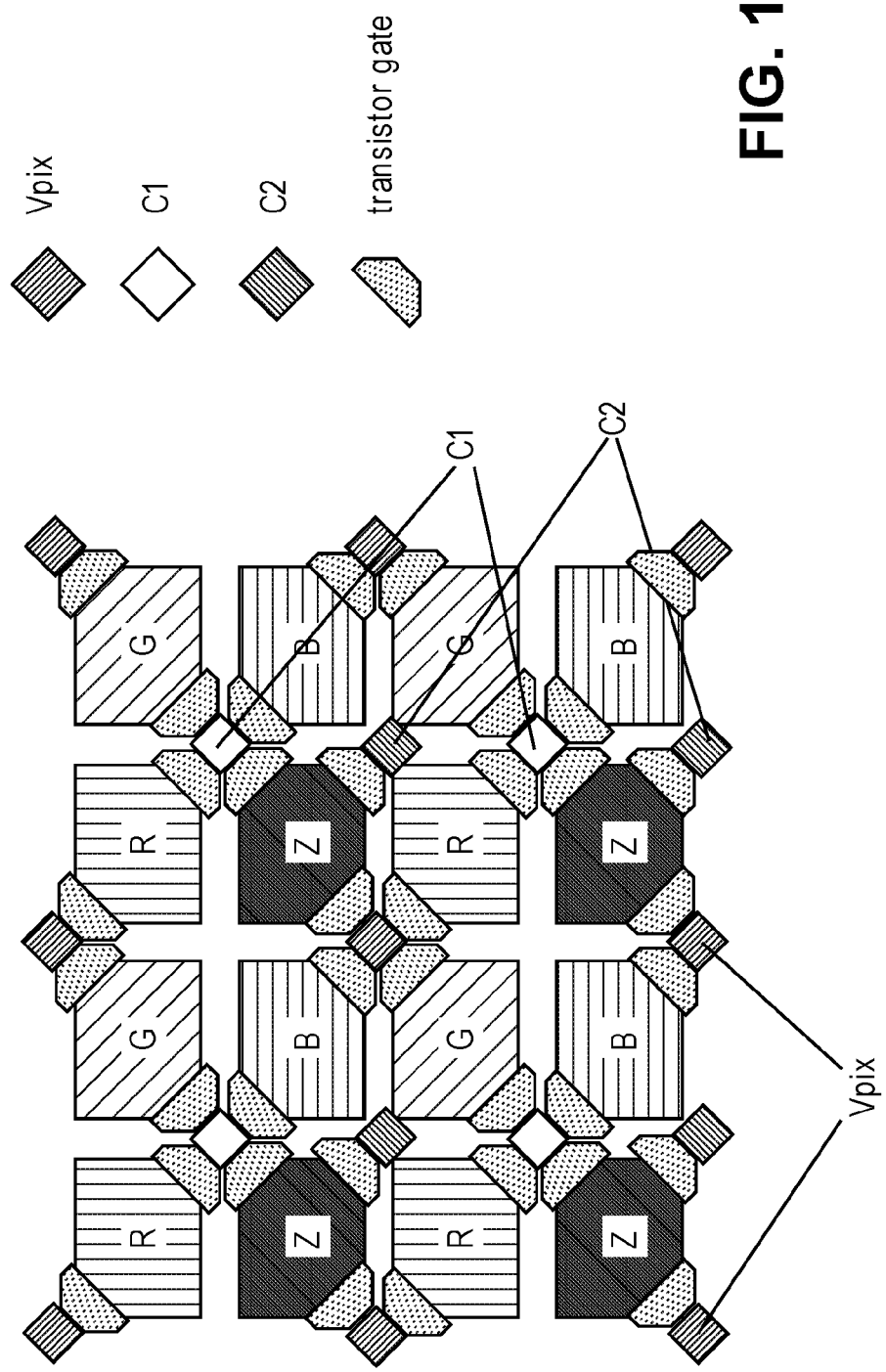
Figure 15:
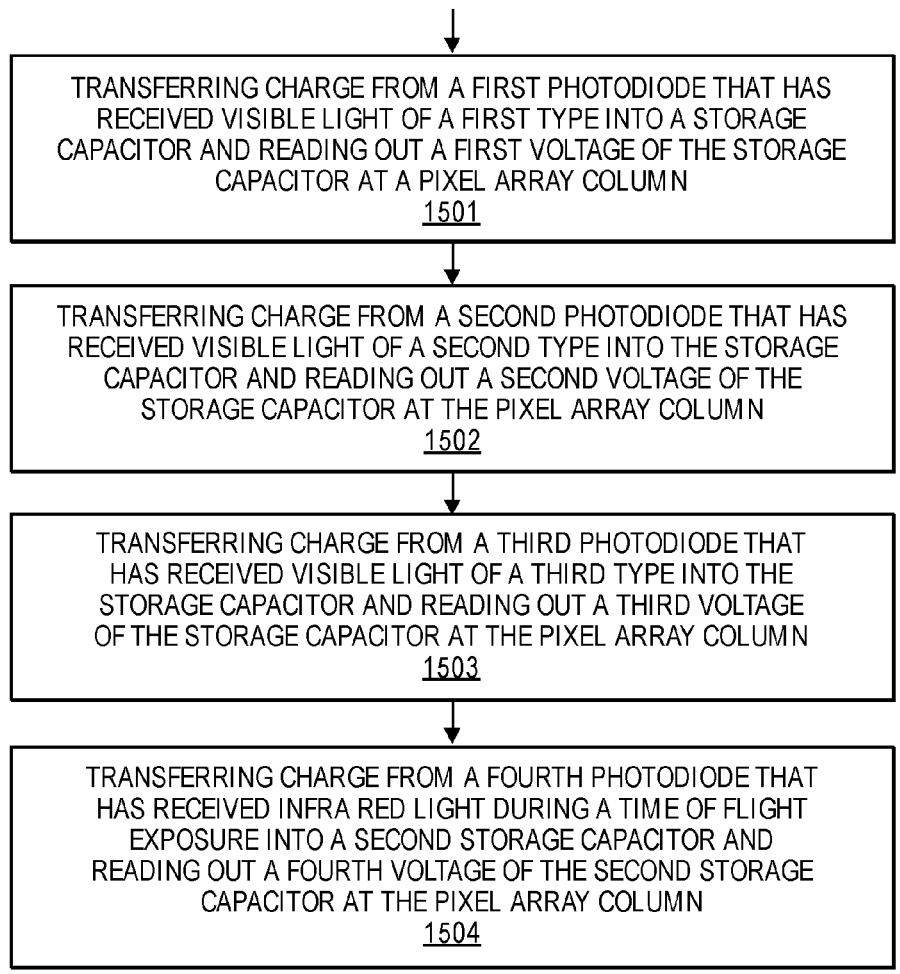

The following description and accompanying drawings are used to illustrate embodiments of the invention. In the drawings:

FIG. 1 shows a depiction of an image sensor (prior art);
FIG. 2 shows a depiction of a visible light pixel cell;
FIG. 3 shows a depiction of a Z pixel cell;
FIG. 4 shows a depiction of a pixel array having an RGBZ pixel;
FIG. 5 shows a first Venn diagram for a first RGBZ pixel unit cell design;
FIG. 6 shows an embodiment of an RGBZ pixel unit cell that conforms to the Venn diagram of FIG. 5;
FIGS. 7a and 7b show layout embodiments for the RGBZ pixel unit cell of FIG. 6;
FIG. 8 shows a second Venn diagram for a second RGBZ pixel unit cell design;
FIG. 9 shows a first embodiment of an RGBZ pixel unit cell that conforms to the Venn diagram of FIG. 8;
FIGS. 10a and 10b show layout embodiments for the RGBZ pixel unit cell of FIG. 9;
FIG. 11 shows a second embodiment of an RGBZ pixel unit cell that conforms to the Venn diagram of FIG. 8;
FIGS. 12a and 12b show layout embodiments for the RGBZ pixel unit cell of FIG. 11;
FIG. 13 shows a third embodiment of an RGBZ pixel unit cell that conform to the Venn diagram of FIG. 8;
FIGS. 14a and 14b show layout embodiments for the RGBZ pixel unit cell of FIG. 13;
FIG. 15 shows a method performed by an RGBZ pixel unit cell;
FIGS. 16a through 16g show a method of manufacture for an RGBZ pixel cell;
FIG. 17 shows an embodiment of a camera system;
FIG. 18 shows an embodiment of a computer system.

DETAILED DESCRIPTION

FIG. 2 shows a circuit design 202 for a visible light pixel. As observed in FIG. 2, initially, a capacitor 201 is cleared of its negative charge by turning on a reset transistor Q1 (which brings the capacitor's voltage to a supply voltage (V_pixel)). When the capacitor's negative charge is cleared and a transfer gate transistor Q2 is turned off, an exposure time begins in which a light sensitive photodiode 203 generates and collects negative charge (electrons) as a function of the intensity of the light that it receives over the exposure time and the length of the exposure time.

After the exposure time, the transfer gate transistor Q2 is turned on which transfers the negative charge that was collected in the photodiode 203 to the capacitor 201. The transfer of the negative charge into the capacitor 201 affects the voltage of the capacitor (the more negative charge the capacitor receives 201 the lower its voltage). After the photodiode's negative charge has been transferred to the capacitor 201, a row select control signal is enabled that turns on a row select transistor Q3 which permits a sense amplifier that is coupled downstream from the pixel cell's column output to sense the capacitor voltage. The reading of the capacitor's voltage is then digitized and used as an indication of the intensity of the light received by the photodiode 203. The process then repeats.

Typically, the row select signal turns on the row select transistor Q3 of every pixel cell along a same row in the pixel array. The row select signal "scrolls" through the rows of the array to receive the entire array image. In the case of a "global shutter" mode, the exposure times are simultaneous across all pixel cells in the array (and the image should not have any motion related artifacts). In the case of a "rolling shutter" mode, the exposure times of the pixel cells are staged, e.g., on a row by row basis (which can permit the existence of motion artifacts).

The existence of the storage capacitor 201 permits the timing of the exposure to be decoupled from the timing of the row select activation and storage capacitor 201 readout. Said another way, after an exposure and the transfer of charge into the storage capacitor 201, the storage capacitor's voltage can remain for a period of time before being read out. As a consequence, an image sensor architecture that supports multiple exposure times per storage capacitor readout are possible. That is, as just one example, an image sensor may be constructed that has three exposures with three corresponding transfers of charge into the storage capacitor 201 for every readout of the storage capacitor 201 in accordance with its row select activation.

FIG. 3 shows a circuit design for a "Z" pixel 302 for image sensors that capture depth information using "time-of-flight" techniques. In the case of time-of-flight image capture, typically, a light source emits infra-red (IR) light from a camera system onto an object and measures, for each of multiple pixel cells of a pixel array, the time between the emission of the light and the reception of its reflected image upon the pixel array. The image produced by the time of flight pixels corresponds to a three-dimensional profile of the object as characterized by a unique depth measurement (z) at each of the different (x,y) pixel locations.

As observed in FIG. 3, the Z pixel design 302 includes a storage capacitor 301, reset transistor Q1, transfer gate transistor Q2, photodiode 303 and row select transistor Q3 that operate similarly as described above with respect to the visible light pixel cell 202. The transfer gate transistor Q2 is turned on-and-off during the exposure time with a clock signal over the course of the exposure. Controlling the transfer gate transistor Q2 with a clock signal during the exposure time of the Z pixel 301 is an artifact of the time of flight technique. In a common approach, the same Z pixel 302 is provided with four different clocks (each separated in phase by 90°) over four different reset, exposure time and readout sequences. The four different charge collection readouts are then combined to calculate the time-of-flight depth value for the pixel.

During the exposure time itself, as mentioned above, the transfer gate transistor Q2 toggles on-and-off under the control of a clock signal. As such, charge is transferred from the photodiode 303 to the storage capacitor 301 multiples times during the exposure sequence. During the half clock cycles when the transfer gate transistor Q2 is off, a "back-drain" transistor Q4 is on to cause charge from the photodiode 304 to flow into the V_pixel supply node. The clock that controls the back-drain transistor Q4 is 180° out-of-phase with the clock that controls the transfer gate transistor Q2 so that while one is on, the other is off.

As such, charge flow out of the photo-diode alternates direction back-and-forth between flowing through the transfer gate transistor Q2 and flowing through the back-drain transistor Q4 over the course of the exposure time. Note however, that turning the transfer gate transistor Q2 on and off during the exposure time of the Z pixel cell is functionally similar to the particular visible pixel cell embodiments mentioned just above in which there are multiple exposures and corresponding charge transfers into the storage capacitor 201 per row select readout.

FIG. 4 shows an embodiment of a pixel array 401 having a pixel unit cell 402 that includes visible light pixels R, G and B and a Z pixel. Although the particular embodiment shows red (R), blue (B) and green (G) pixels as the visible light pixels, other embodiments may use different colored pixel schemes (e.g., Cyan, Magenta and Yellow). For simplicity the remainder of the present application will largely refer to an RGB visible light pixel scheme.

A challenge in the layout design of the unit cell 402 is to expand the surface area of the photodiodes (to enhance optical sensitivity) while preserving enough semiconductor surface area space to place the transistors associated with the pixel unit cell circuit design near or within the unit cell (e.g., where such proximity is appropriate or necessary). That is, the more space such transistors consume, the less space there will be to collect light and vice-versa, the more space there is to collect light, the less space there is to place the transistors.

As an additional concern, generally, the storage capacitor used for a visible light pixel design should be smaller to reduce noise during readout while the storage capacitor used for a Z pixel design should be larger to promote larger infrared detection pixel capacity.

A solution is to have the visible light pixels share the same storage capacitor, and, introduce a second storage capacitor for the Z pixel. With the visible light pixels sharing the same storage capacitor, the space that would otherwise be consumed by the eliminated storage capacitors is preserved. The shared storage pixel can also be made small consistent with the desire to reduce readout signal noise for visible light pixels. Additionally, the second storage capacitor for the Z pixel can be made larger than the visible light storage capacitor consistent with the desire to have larger infrared detection pixel capacity.

FIG. 5 shows a Venn diagram 500 for an RGBZ pixel unit cell design that is consistent with this approach. As observed in FIG. 5, each of the R, G and B pixels use the same storage capacitor C1. By contrast, the Z pixel has its own storage capacitor C2 that has larger capacitance than capacitor C1.

FIG. 6 shows an embodiment of a design for an RGBZ pixel unit cell 600 that conforms to the Venn diagram 500 of FIG. 5. As observed in FIG. 6, the respective transfer gate transistor Q2_R, Q2_G, Q2_B for each of the R, G and B photodiodes is coupled to the same storage capacitor C1. Apart from the merged RGB pixel circuit 601 exists a separate, different Z pixel circuit 602. Both the merged RGB pixel circuit 601 and the Z pixel circuit 602 have their own respective readout circuits that are coupled to the same array column 603. As such, for example, a same sense amplifier may sense the readout voltage from both pixel circuits 601, 602.

Readouts of the respective voltages of the C1 and C2 capacitors are made at different times (i.e., they cannot be simultaneously read out). Additionally, readouts for the visible light photodiodes are made at different times for the different colors because of the sharing of the C1 capacitor. Visible light readouts may be made sequentially, e.g., first a red readout is made, then a green readout is made, then a blue readout is made and then the process repeats. Charge collected by the R, G and B photodiodes can be accumulated simultaneously (or serially).

However, a transfer of charge from any particular visible light photodiode to capacitor C1 is made in isolation (i.e., if any one of the RGB transfer gate transistors Q2_R, Q2_G, Q2_B is on for the purpose of measuring incident light the other two transfer gate transistors are off). Thus charge transfers into C1, like readouts from C1, are made sequentially rather than in parallel. Charge collected in a visible light photodiode can be "cleared" by enabling both its transfer gate transistor and the reset transistor Q1_RGB. In this case, multiple visible light photodiodes can be cleared simultaneously by enabling each of the Q2_R, Q2_G, Q2_B transistors and the reset transistor Q1_RGB.

According to one embodiment, the following timing scheme is implemented for the RGB pixel circuit. First, capacitor C1 is cleared of charge by activating the reset transistor while the row select transistor is off. Charge within one or more of the visible light photodiodes can be simultaneously cleared with C1 by enabling the respective transfer gate transistor of each photodiode to be cleared. During exposure time of a particular visible light photodiode its transfer gate transistor is off. Then, charge from the photodiode is transferred into C1 by activating its transfer gate transistor while the other transfer gate transistors and the reset and row select transistors are off. The voltage on C1 from the first photodiode is subsequently sensed by activating the row select transistor Q3_RGB and the reset transistor Q1_RGB being off (all three transfer gate transistors may also be off). The charge on C1 is then cleared via reset and the process repeats two more times for each of the other photodiodes. The entire process then repeats.

According to one embodiment the following time scheme is implemented for the Z pixel circuit 602. The voltage on capacitor C2 is cleared by activating the reset transistor Q1_Z with the row select transistor Q3_Z being off. Either of the transfer gate or back-drain transistors Q2_Z, Q4_Z may also be on to clear any charge in the Z photo-diode. An exposure time then begins in which a first clock signal is applied to the gate of the transfer gate transistor Q2_Z and a second clock that is 180° out of phase with the first clock signal is applied to the gate of the back drain transistor Q4_Z. For those portions (e.g., 50%) of the first clock cycle that correspond to a logic level that activates the transfer gate transistor Q2_Z, charge is transferred from the Z photodiode into C2. For the remaining portions in which the second clock signal corresponds to a logic level that activates the back drain transistor Q4_Z charge is transferred from the Z photodiode into the Vpix voltage supply terminal.

After the exposure time both clock signals are squelched to turn off both the transfer gate transistor Q2_Z and the back drain transistor Q4_Z and the reset transistor Q1_Z remains off. Subsequently the row select transistor Q3_Z is turned on so that the voltage on capacitor C2 can be sensed. The process then repeats three more times such that four different instances of the first clock signal (and corresponding second clock signal) having phases of 0°, 90°, 180° and 270° have been applied to the Z pixel circuit. The readouts from capacitor C2 for the four different phases are processed downstream to determine a depth value for the Z pixel. The entire process for a next set of 0°, 90°, 180° and 270° clock signals is then repeated for a next Z pixel depth value.

In operation, the RGB pixel cell circuit 601 and the Z pixel cell circuit 602 may operate in series or in parallel so long as their respective readouts are made at different times. Likewise, R, G and B pixel values may be generated at the same rate as Z pixel values or at different rates. However, in a higher performance embodiment, R, G and B pixel values are generated more frequently than Z pixel values owing to the longer Z pixel exposure times (multiple R, G and B pixel readouts are made during the Z exposure time). If the R, G and B pixels are to have readouts at a same or slower rate than the Z pixel, the respective transfer gate transistors Q2_R, Q2_G, Q2_B for the R, G and B pixels may also be used as back-drain transistors to bleed charge off the R, G and B photodiodes that may accumulate, e.g., during the lengthy Z exposure. Here, both the RGB transfer gate transistors Q2_R, Q2_G, Q2_B and the RGB reset transistor Q1_RGB are activated to force the voltage on capacitor C1 to a Vpix supply voltage level and permit charge to bleed out of a photo-diode into capacitor C1.

FIGS. 7a and 7b shows two different layout embodiments for the R, G, B and Z photodiodes as well as the transfer gate transistors Q2_R, Q2_G_Q2_B, Q2_Z, back drain transistor Q4, C1 and C2 capacitors. Here, as the transfer gate and back drain transistors are directly coupled to a photo-diode they are typically integrated within the same semiconductor surface area as the photodiodes. The other transistors of the RGB pixel circuit and the Z pixel circuit may be located, e.g., at the periphery of the pixel array or at the periphery or a macro-cell (e.g., a group of RGBZ unit cells) within the surface area of the pixel array. One or more of the other transistors may also be integrated within the RGBZ unit cell at the expense of photodiode surface area.

As observed in FIGS. 7a and 7b, the transfer gate transistors Q2_R, Q2_G, Q2_B for the RGB pixel cell circuit reside at facing corners of the R, G and B photodiodes with the C1 capacitor being formed in a region that exists at, just outside or near the active regions for each of the three transfer gate transistors Q2_R, Q2_G, Q2_B. The transfer gate and back drain transistors Q2_Z, Q4 for the Z photodiode are formed at corners of the Z photodiode other than the corner that faces C1 and the RGB transfer gate transistors. C2 is formed in a region that exists at, just outside or near the active region of the Z transfer gate transistor.

As observed in FIGS. 7a and 7b the gate electrode for the Q2_R, Q2_G, Q2_B, Q2_Z and Q4 transistors may be proximately placed near or at edges of their respective photodiodes. In an embodiment, a first source/drain region for each of these transistors is spatially integrated with its respective photodiode (e.g., by having it's implant reside within the photodiode). In a same or different embodiment, a second source/drain region of these transistors is spatially integrated with C1, C2 or Vpix depending on the specific transistor For example, in the case of transistor that is coupled to C1 or C2, the transistor's source/drain region resides within an implant used to form C1 and C2 and/or receives a contact that is an electrode for C1 or C2. In the case of transistor that is coupled to Vpix, the transistor's source/drain region receives a contact that is tied to the Vpix supply voltage potential.

FIGS. 7a and 7b are different in terms of which two of the three "available" (i.e., not facing the RGB transfer gate transistors and C1) corners of the Z pixel are consumed by the Z pixel transfer gate transistor Q2_Z and the back drain transistor Q4_Z. Another embodiment (not shown) corresponds to the embodiment of FIG. 7a with the positions of the transfer gate transistor Q2_Z and capacitor C2 being swapped with the position of the back drain transistor Q4. An even further embodiment (also not shown) corresponds to the embodiment of FIG. 7b with the positions of the transfer gate transistor Q2_Z and capacitor C2 being swapped with the position of the back drain transistor Q4.

In various embodiments both of the C1 and C2 capacitors may be formed at least in part as diffusion capacitances. C2 may be made larger than C1 by having any of a different implant than C1, having a larger surface area than C1 or having more (e.g., extensive, elaborate, larger) metal structures formed over it than C1 so that it essentially has larger electrode plate surface area than C1.

FIG. 8 shows a Venn diagram 800 for another RGBZ pixel unit cell in which the visible light pixels share the same capacitor C1, and, introduce a second capacitor C2 for the Z pixel. However, unlike the approach observed in FIG. 5, the Z pixel in the approach of FIG. 8 not only has its own larger capacitor C2 but also shares in the use of capacitor C1 or is at least coupled to capacitor C1 in some way. In designs where the Z pixel actually uses C1 as a storage node for charge from the Z photodiode, only a single readout circuit may be utilized (i.e., both the RGB and Z pixel circuits use the same readout circuit since the circuits are coupled at the storage capacitance node).

FIG. 9 shows an embodiment 900 of an RGBZ pixel unit cell that conforms to the Venn diagram of FIG. 8. As observed in FIG. 9, the respective transfer gate transistor Q2_R, Q2_G, Q2_B for each of the R, G and B photodiodes is coupled to the same storage capacitor C1. Apart from the merged RGB photodiode, transfer gate and C1 capacitance circuit exists a separate, different Z photodiode, transfer gate and C2 capacitance circuit. However, the merged RGB circuit and the Z circuit are coupled together through transistor Q5 so that charge from the Z photodiode can be transferred into both capacitors C2 and C1 during exposure of the Z pixel. This has the effect of increasing the capacitance for the Z pixel to C1+C2. In an embodiment, C2 has larger capacitance than C1. In another embodiment C1 and C2 have approximately the same capacitance.

The coupling between the RGB and Z circuits through transistor Q5 permits the two pixel circuits to share the same readout circuit as well. Here, transistor Q5 is essentially used to establish a common node between capacitors C1 and C2 during the exposure of the Z pixel and during the Z pixel readout. As such, in an embodiment, transistor Q5 is on during Z pixel exposure and during Z pixel readout (but, e.g., is off otherwise).

The RGB pixel cell operates largely as described above with respect to FIG. 6. However, note that the use of capacitor C1 by the Z pixel circuit causes an extra reset of capacitor C1 by the RGB reset transistor. Specifically, after the voltage on capacitor C1 for one of the visible light pixels has been read out, a reset of capacitor C1 will take place to prepare capacitor C1 to receive charge from the Z photodiode (this reset does not exist in the embodiment of FIG. 6). After the reset, charge is received in capacitor C1 from the Z photodiode and the voltage on capacitors C1 and C2 is readout. Capacitor C1 is then reset again to prepare it to receive charge from a visible light photodiode.

The Z pixel cell also operates largely as described above with respect to FIG. 6. Here, however, as mentioned just above, during the exposure of the Z pixel, transistor Q5 is also activate to permit the transfer of charge from the Z photodiode into capacitor C1. Transistor Q5 remains activate until the voltage on capacitors C1 and C2 is readout.

Because of the coupling between the RGB pixel cell and the Z pixel cell, the two cells are less able to operate in parallel and in isolation within another as compared to the circuit of FIG. 6. That is, whereas the RGB and Z pixel circuits 601, 602 of FIG. 6 can operate fully simultaneously and without reference to one another (other than they cannot be readout simultaneously), by contrast, in the approach of FIG. 9, charge from the R, G or B photdiodes can not be transferred into C1 during Z pixel exposure. As the Z exposure may take an extended period of time (because exposures are taken at four different clock phases), back-drain transistors Q4_R, Q4_G, Q4_B are respectively coupled to each of the R, G and B photdiodes to bleed off charge that they may accumulate during the Z pixel exposure. As such, in an embodiment, transistors Q4_R, Q4_G, Q4_B are off during R, G, B pixel exposure but are on during Z pixel exposure.

FIGS. 10a and 10b show RGBZ unit cell layout embodiments for the circuit of FIG. 9. As a point of comparison with the embodiments of FIGS. 7a and 7b for the circuit of FIG. 6, the embodiments of FIGS. 10a and 10b additionally show the back drain transistors Q4_R, Q4_G, Q4_B for the visible light pixels. Transistor Q5 is not coupled directly to a photodiode and therefore can be placed at the periphery of the array, the periphery of a macro-cell or within the unit cell with a commensurate loss of photodiode surface area size.

FIGS. 10a and 10b are different in terms of which two of the three "available" (i.e., not facing the RGB transfer gate transistors and C1) corners of the Z pixel are consumed by the Z pixel transfer gate transistor Q2_Z and the four back drain transistors Q4_R, Q4_G, Q4_B, Q4_Z. Another embodiment (not shown) corresponds to the embodiment of FIG. 10a with the positions of the four back drain transistors Q2_Z and capacitor C2 being swapped with the position of the back drain transistor Q4_R, Q4_G, Q4_B, Q4_Z. An even further embodiment (also not shown) corresponds to the embodiment of FIG. 10b with the positions of the back drain transistor Q4_R, Q4_G, Q4_B, Q4_Z and capacitor C2 being swapped with the position of the back drain transistor Q4.

Note than in the embodiment of FIG. 10a, the pixel unit cell can be viewed as having "inner halves" of two different Vpix physical nodes located on opposite sides of the cell. That is, each Vpix physical node is shared by two neighboring pixel unit cells. By contrast, in the embodiment of FIG. 10b, the pixel unit cell can be viewed as having "inner quarters" of four different Vpix physical nodes located at four different corners of the pixel unit cell. That is, each Vpix physical node is shared by four different pixel unit cells.

FIG. 11 shows another embodiment that conforms to the Venn diagram of FIG. 8. As observed in FIG. 11 the Z pixel cell's use of capacitor C1 is achieved through the back drain transistor Q4. Here, however, the capacitor C1 is not used as a storage node for the Z photodiode but rather is used as a Vpix supply voltage node. As such, capacitor C1 is used to support the back-drain transistor Q4 according to its normal/traditional operation during Z exposure. The C1 capacitor can be brought to the Vpix voltage level by activating the reset transistor Q1_RGB of the RGB pixel cell circuit. Thus, in an embodiment of FIG. 11, the RGB reset transistor Q1_RGB is made active not only to reset C1 prior to an R, G or B exposure, but is also made activate during Z exposure to force capacitor C1 to act as a Vpix voltage node to support the operation of the Z pixel back drain transistor Q4.

Restrictions as to when the visible RGB photodiodes can transfer charge to capacitor C1 and when capacitor C1 can be read out are similar to those described above with respect to FIG. 9. That is, the RGB pixel cell and Z pixel cell are limited as to how simultaneously they can operate in isolation to one another. Specifically, an R, G or B photodiode can not have its charge transferred to capacitor C1 during Z exposure. The use of C1 as a Vpix voltage node during Z exposure, however, eliminates the extra reset sequence of capacitor C1 (described above with respect to FIG. 9) to clear the charge from the Z photodiode. That is, with capacitor voltage being set to Vpix during Z exposure, capacitor C1 effectively remains at a reset level during Z exposure and therefore is ready to accept charge from an R, G or B pixel immediately after Z pixel exposure and charge transfer into C2.

The embodiment of FIG. 11 has separate readouts for the pair of capacitors C1 and C2 since the former is used to accept charge from RGB photodiodes and the later is used to store charge from the Z photodiode. Unlike the approach of FIG. 9, each of the RGB photodiodes of the approach of FIG. 11 do not require back-drain transistors because any overflow charge accumulated by an RGB photodiode during Z exposure can be bled off into capacitor C1 through its respective transfer gate transistor. As such, the RGB transfer gate transistors Q2_R, Q2_G, Q2_B act not only as transfer gate transistors but also as back-drain transistors. In an embodiment, therefore, the RGB transfer gate transistors Q2_R, Q2_G, Q2_B are active not only during a charge transfer for their respective photodiode but also during Z exposure.

FIGS. 12a and 12b show different RGBZ pixel cell layout embodiments for the circuit design of FIG. 11. As the approach of FIG. 11 does not include a back-drain transistor that is coupled to a specially created Vpix supply voltage node, unlike the previous embodiments, the layout approach of FIGS. 12a and 12b do not include a Vpix voltage node. Additionally, the back drain transistor Q4 for the Z photodiode is directly coupled to capacitor C1. Note that the Z transfer gate Q2_Z can occupy any of the three corners of the Z photodiode not consumed by the back drain transistor Q4.

It is pertinent to recognize that the various activation/de-activation schemes for various ones of the transistors described above with respect to the circuit design embodiments of FIGS. 6, 9 and 11 may be implemented by an image sensor timing and control circuit that is coupled to and provides the control signals to each of these transistors to establish their on/off state.

Note also that the RGBZ unit cell should appropriately filter light into its respective pixels. That is, in an embodiment, the R photodiode should receive red light by forming a filter structure above it that substantially passes only red light, the G photodiode should receive green light by forming a filter structure above it that substantially passes only green light, the B photodiode should receive blue light by forming a filter structure above it that substantially passes only blue light and the Z photodiode should receive infra-red light by forming a filter structure above it that substantially passes only infra-red light.

FIG. 13 shows two embodiments 1301, 1302 of an RGBZ pixel unit cell design approach that conforms to the Venn diagram of FIG. 8. As observed in FIG. 13, both embodiments 1301, 1302 include a second transfer gate transistor Q2_Z_2 to increase the amount of charge collected during Z exposure. That is, recall that in a typical implementation the Z photodiode is coupled to a transfer gate transistor and a back-drain transistor. During Z exposure a first clock signal is applied to the transfer gate transistor and a second clock signal is applied to the back-drain transistor where the first and second clocks are 180° out of phase. As such, when the first clock turns on the transfer gate transistor charge is transferred into a storage capacitor that is later readout to detect received optical intensity. By contrast, when the second clock turns on the back-drain transistor charge is transferred into a supply node.

The flow of charge into the supply node can be viewed as a loss of signal that decreases the sensitivity of the Z pixel. By contrast, the embodiments 1301, 1302 of FIG. 13 apply the first and second clock signals to first and second transfer gate transistors Q2_Z_1, Q2_Z_2 that are coupled to capacitors C2 and C1 respectively. As such, during Z exposure, the charge that traditionally would flow to a supply node during back-draining would instead flow into capacitor C1 when the second clock signal turns Q2_Z_2 on. As such, more charge is collected during Z exposure resulting in a more sensitive Z pixel.

During readout, the voltage on C1 is sensed and then the voltage on C2 is sensed (or first C2 is sensed and then C1 is sensed). Downstream (e.g., with analog, digital or mixed signal circuitry downstream from the sense amplifiers) the two voltage readings are combined to produce a single reading for the pair of clock signals during the Z exposure. The process then repeats, e.g., one more time with clock pairs that are 90° out of phase with the first and second clock signal pair that were just applied. In an embodiment capacitance C1 is made approximately equal to capacitance C2 so that same voltage readings from the pair of capacitors C1, C2 correspond to same amounts of received charge.

With respect to readout, the first embodiment 1301 differs from the second embodiment 1302 in that first embodiment 1301 has one readout circuit while the second embodiment 1302 has separate readout circuits for each of capacitor C1 and capacitor C2. The first embodiment 1301 includes transistor Q5 to couple C2 to the readout circuit when the voltage on capacitance C2 is being sensed. The first embodiment 1301 also includes a single reset transistor Q1 to reset both C1 and C2. C1 and C2 can be reset (e.g., after both have been readout after a Z exposure) simultaneously by keeping Q5 active during the reset.

In an embodiment, the first embodiment 1301 keeps transistor Q5 off during Z exposure. During Z exposure the pair of clock signals are applied to Q2_Z_1 and Q2_Z_2 to alternatively transfer charge into C2 and C1 respectively. Additionally, the RGB transfer gate transistors are off and the RGB back-drain transistors Q4_R, Q4_G, Q4_B are turned on to prevent blooming from the RGB pixels during Z exposure.

When Z exposure is complete Q5 remains off while the voltage on C1 is sensed by activating the row select signal (RS) of the readout circuit. After the voltage on C1 is readout, and transistor Q5 is turned on to couple C2 to the readout circuit. The voltage on C2 is then sensed. After the voltages on C1 and C2 have been sensed, Q5 remains on to couple both C1 and C2 to the reset transistor Q1. The reset transistor Q1 is then activated to clear the charge on both C1 and C2. Transistors Q2_Z_2 and Q5 are then turned off to decouple the Z pixel from the RGB pixels, e.g., in preparation for RGB exposure.

During RGB exposure both Z transfer gate transistors Q2_Z_1 and Q2_Z_2 are off and the Z back drain transistor Q4_Z is on. The RGB transfer gate transistors are activated and the back-drain transistors deactivated consistent with embodiments discussed above. For example, in one embodiment, one RGB pixel is exposed while the other two RGB pixels are not exposed. That is, the back-drain transistor is off and the transfer gate transistor is on for the RGB pixel being exposed while the back-drain transistor is on and the transfer gate transistor is off for the other two pixels that are not being exposed. Charge from the exposed photodiode is transferred into C1 and the voltage on C1 is readout. The voltage on C1 is then cleared and, e.g., either another RGB exposure can take place (for one of the pixels that was not exposed) or a Z exposure can take place.

In the case of the second embodiment 1302 transistor Q5 is eliminated because of the separate readout and reset circuits. During Z exposure gate transistor Q2_Z_1 is controlled by the first clock signal and charge flows from the Z photodiode into C2. Also, transfer gate transistor Q2_Z_2 is controlled by the second clock signal and charge flows from the Z photodiode into C1. After Z exposure one of the readout circuits is activated to sense the voltage on one of the capacitors (the other readout circuit is deactivated). After the first readout, the other readout circuit is activated (the first is deactivated) to sense the voltage on the second capacitor (the first capacitor may be reset at this time). After both capacitors have been readout the voltages on the later or both capacitors are reset. Otherwise, operation is as discussed above for the first embodiment.

FIGS. 14a and 14b show layout embodiments for the embodiments 1301, 1302 of FIG. 13 discussed above. As observed in FIG. 14, R, G and B transfer transistor gates are coupled between the R, G and B photodiodes and C1 as in previous layout embodiments. However, unlike previous embodiments, a second Z pixel transfer gate transistor gate Q2_Z_2 is coupled between the Z photodiode and C1. This particular layout approach is achievable at least with the second embodiment. The other observed layout features have been discussed in preceding layout embodiments.

FIG. 15 shows a methodology performed by the RGBZ pixel unit cell embodiments discussed above. The method includes transferring charge from a first photodiode that has received visible light of a first type into a storage capacitor and reading out a first voltage of the storage capacitor at a pixel array column 1501. The method also includes transferring charge from a second photodiode that has received visible light of a second type into the storage capacitor and reading out a second voltage of the storage capacitor at the pixel array column 1502. The method also includes transferring charge from a third photodiode that has received visible light of a third type into the storage capacitor and reading out a third voltage of the storage capacitor at the pixel array column 1503. The method also includes transferring charge from a fourth photodiode that has received infra red light into a second storage capacitor and reading out a fourth voltage of the second storage capacitor at the pixel array column 1504.

Figure 16A:
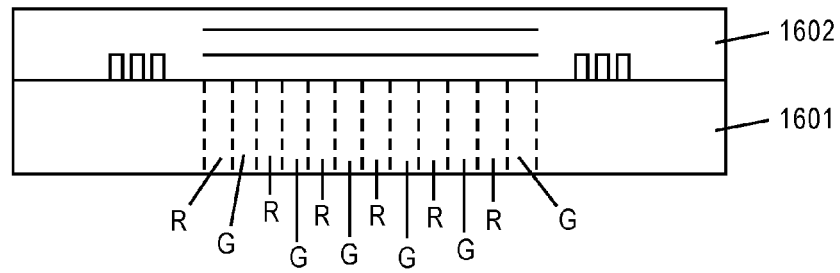

FIGS. 16a through 16e show a method for manufacturing an image sensor having any of the RGB unit cell design strategies discussed above with respect to FIGS. 4 through 15 and that further includes an RGBZ filter structure that is consistent with these designs. FIG. 16a shows a cross section slice of an image sensor along an axis of the pixel array having a pair of visible light pixels (R and G as observed in FIG. 16a). Here, the semiconductor substrate 1601 shows the general location of the photo-sensitive regions of the R and G photo-diodes. Metallization 1602 deposited on the substrate form the transistor gates and source/drain contacts and metallization deposited above the substrate form the transistor and circuit interconnect associated with the pixel unit cell designs and other image sensor circuitry. The metallization and transistor structures may be formed into any of the various features discussed above with respect to FIG. 4 through 14a,b.

Figure 16B:
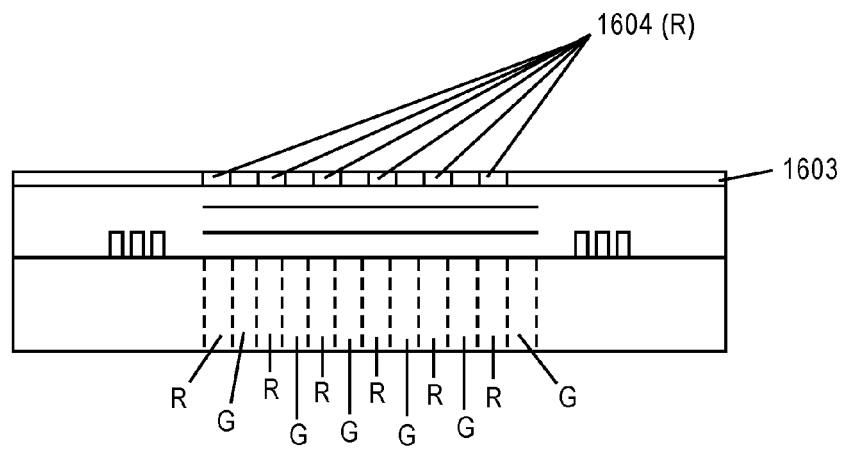
Figure 17:
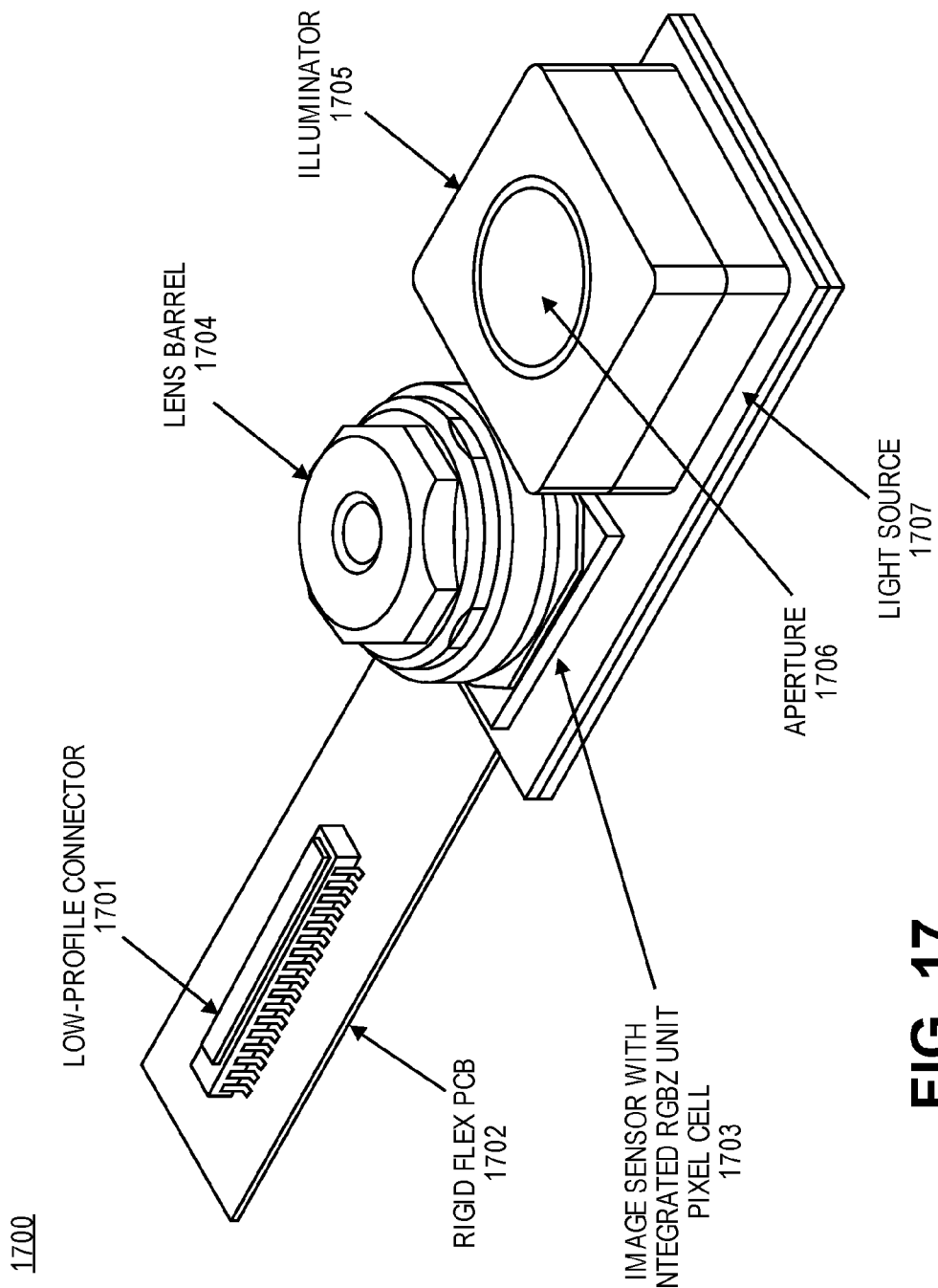

After the interconnect metallization formation, as observed in FIG. 16b, a mordent or transparent layer 1603 is formed over the surface over the underlying structure. Then, visible light filters 1604 of a first type (e.g., a red colored "R" filter as observed in FIG. 16b) are formed in the mordent or transparent layer 1603 by dying the layer the appropriate color in the appropriate region. Specifically, as observed in FIG. 16b, the R pixel regions of the mordent/transparent layer are dyed red. The dying may be implemented by heat transferring a mordent dye through a photoresist mask into a mordent layer and then stripping the mask, or, imbibing a dye into a transparent layer through a photoresist mask and then stripping the mask. Here, the photoresist and masking is patterned so as to expose the regions of interest (the R pixel regions) and block out the other others regions (the GB and Z regions). Specifically, photoresist is deposited or coated on the mordent/transparent layer. The photoresist is then exposed with a mask that features the R pixel regions. The photoresist is then etched to expose the underlying transparent/mordent layer in the R regions of the pixel array.

Figure 16C:
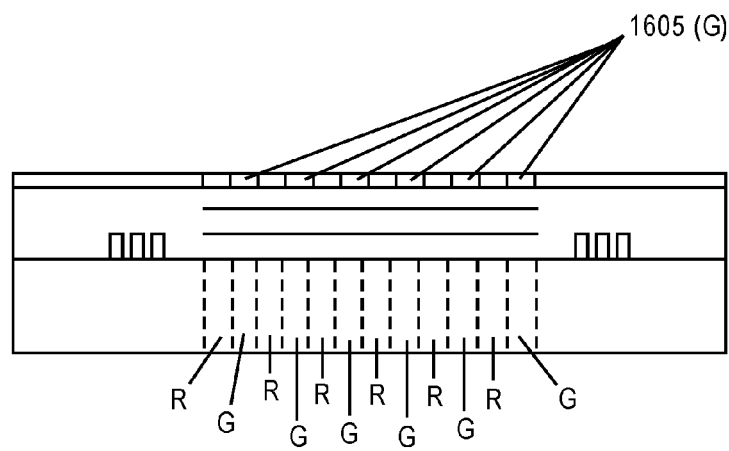
Figure 16D:
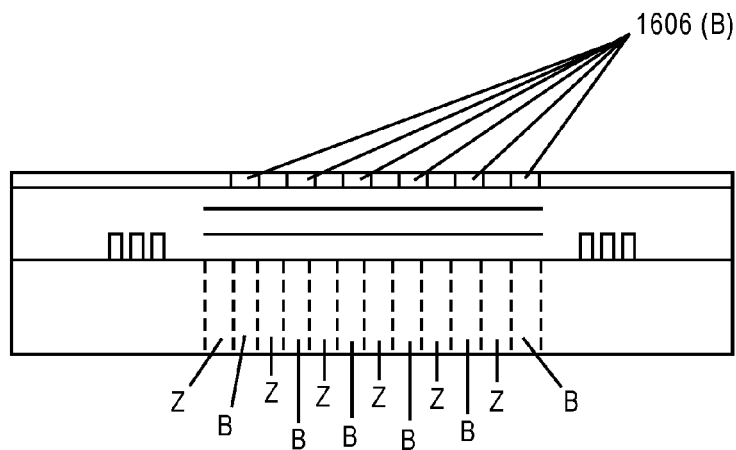

As observed in FIG. 16c, visible light filters of a second type 1605 (e.g., a green colored "G" filter as observed in FIG. 16c) are formed over the interconnect metallization by, e.g., dyeing the appropriate (G) pixel regions of the mordent/transparent layer 1403 green through the techniques discussed above. FIG. 16d shows the cross section slice of an image sensor along another other axis of the pixel array having visible light pixels of a third type (B) and a Z pixel after formation of the B filters 1606 according to the same techniques used to form the R and G pixels discussed above (the already formed R and G filters in the background are not depicted for ease of drawing).

Figure 16E:
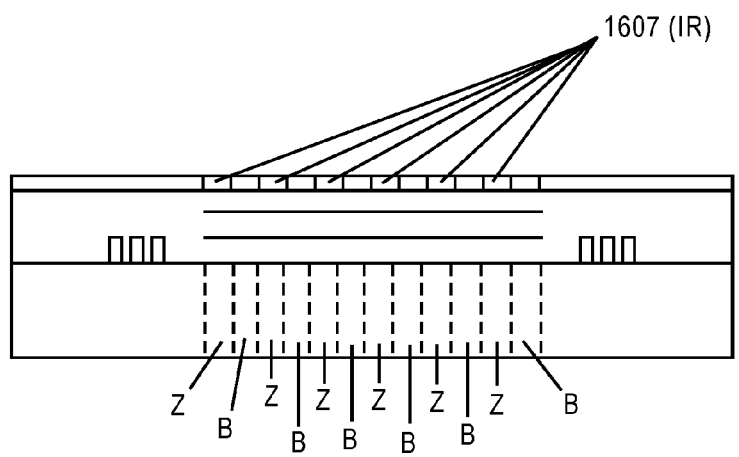

As observed in FIG. 16e, the IR filters 1607 are formed in the Z pixel regions of the image sensor. The IR filters pass IR light and substantially block visible light. The IR filters 1607 may be formed by forming a photoresist layer over the transparent/mordent layer 1603 and then exposing the photoresist with a mask that features the Z pixel regions of the pixel array. The photoresist layer is then etched to expose the transparent/mordent layer in the Z pixel regions. The underlying transparent/mordent layer may also be etched in the Z pixel regions and a material that substantially passes only IR light may be deposited into the exposed regions. The resulting structure is shown in FIG. 16e. Alternatively, the underlying mordent or transparent layer may remain in the Z pixel regions and the IR filter may be deposited on top of the layer with photo-masking techniques like those described above.

In embodiments where the IR filter is formed within a same layer as the RGB filters, the four pixel types may be formed in any order.

Figure 16F:
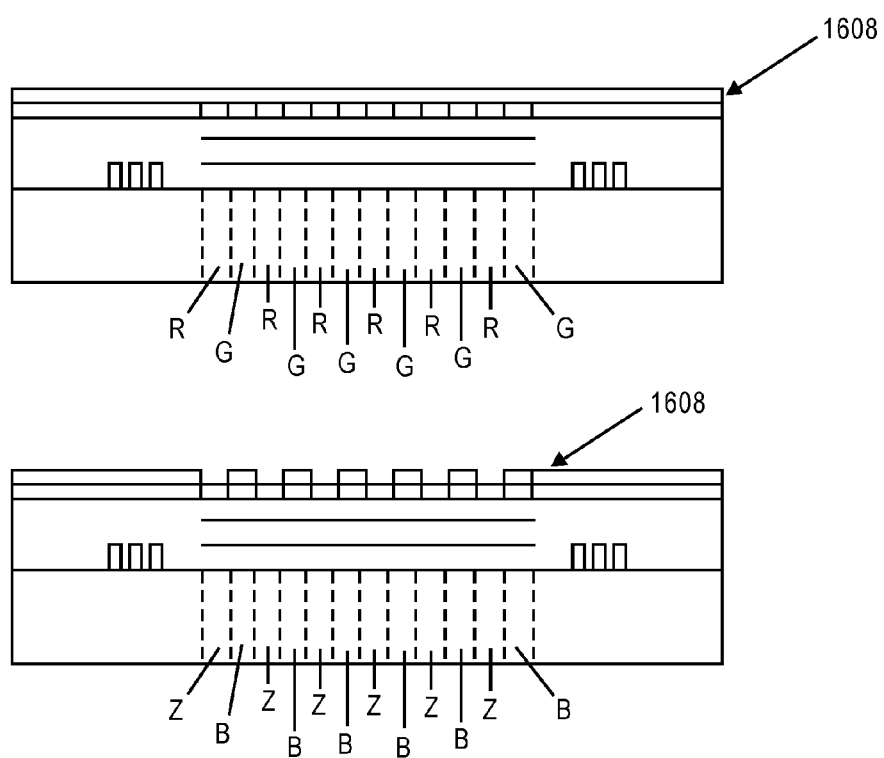

After the IR filter is formed, as observed in FIG. 16f, an IR-cut filtering layer 1608 is deposited or coated on the underlying structure and etched above the Z pixel regions (e.g., using photoresist and masking techniques). As such, an IR-cut filter is essentially placed over the R, G and B pixel locations. The IR-cut filtering layer 1608 is made of a material that substantially blocks infrared light. In various embodiments the IR-cut layer 1608 is helpful because traditional RGB filters may not substantially block infrared light and, in the context of an RGBZ image sensor for use in a time-of-flight system, without an IR-cut filter the RGB pixels may respond to the infrared light from the time-of-flight illuminator. As such, the IR-cut filters help isolate the visible light and time-of-flight imaging systems.

Additionally the IR-cut filters help prevent the RGB pixels from saturating during the Z exposure process which may also alleviate the need for back-draining the RGB pixels during Z exposure, prevent "blooming" (where oversaturated pixels bleed charge into neighboring pixels) or at least make more straightforward any RGB reset that occurs after a Z exposure. Note that to the extent blooming of the RGB filters may remain a concern, back-drain transistors may be coupled to any/all of the RGB photodiodes discussed in various embodiments. As such, for example, the embodiments of FIGS. 6, 7a, 7b and 11, 12a, 12b may additionally include back-drain transistors for the RGB photodiode and therefore include the back-drain structures observed in FIGS. 10a and 10b.

Figure 16G:
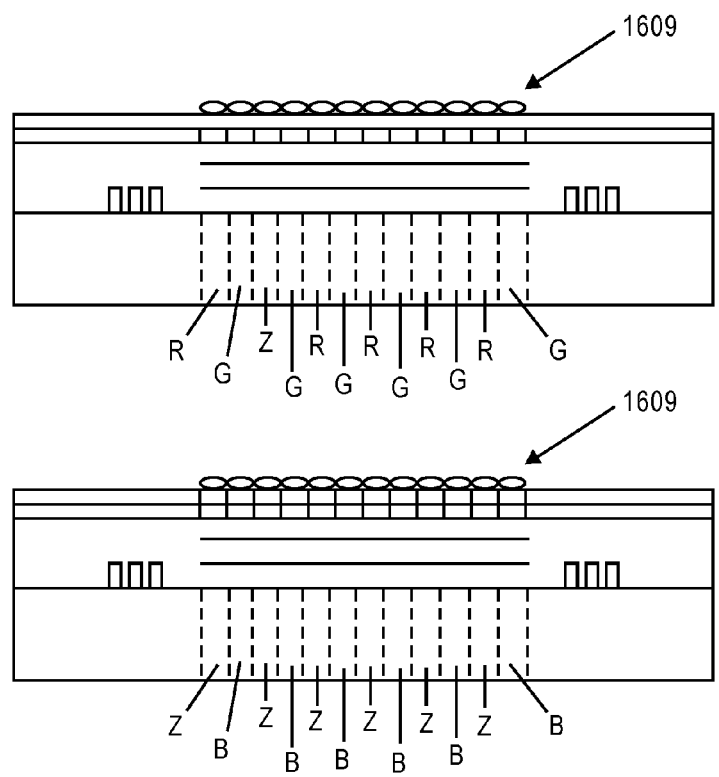

As observed in FIG. 16g, micro-lenses 1609 are formed over the filters. Here, a transparent layer (e.g., The micro-lenses can be formed by any of a number of various processes such as: 1) coating and baking one or more photoresist layers on the underlying structure, patterning the photoresist layers into, e.g., circles/cylinders representing the micro-lens array and then melting the photoresist circles/cylinders into the shape of the micro-lenses; 2) performing the process of 1) above on a layer on a transparent layer (e.g., fused silica) and using the melted photoresist as a mask for a RIE etch into the transparent layer (which completes the form of fuller micro-lenses into the transparent layer); 3) micro-jetting droplets aimed on the underlying structure in the array pattern and solidifying the droplets.

FIG. 17 shows an integrated traditional camera and time-of-flight imaging system 1700. The system 1700 has a connector 1701 for making electrical contact, e.g., with a larger system/mother board, such as the system/mother board of a laptop computer, tablet computer or smartphone. Depending on layout and implementation, the connector 1701 may connect to a flex cable that, e.g., makes actual connection to the system/mother board, or, the connector 1701 may make contact to the system/mother board directly.

The connector 1701 is affixed to a planar board 1702 that may be implemented as a multi-layered structure of alternating conductive and insulating layers where the conductive layers are patterned to form electronic traces that support the internal electrical connections of the system 1700. Through the connector 1701 commands are received from the larger host system such as configuration commands that write/read configuration information to/from configuration registers within the camera system 1700.

An RGBZ image sensor 1703 is mounted to the planar board 1702 beneath a receiving lens 1704. The RGBZ image sensor 1703 includes a pixel array having an RGBZ unit pixel cell. The RGB pixel cells are used to support traditional "2D" visible image capture (traditional picture taking) functions. The Z pixel cells are sensitive to IR light and are used to support 3D depth profile imaging using time-of-flight techniques. The RGBZ pixel unit cell may have RGB pixel cells that share a same storage capacitor and/or any of the other features discussed above with respect to FIGS. 4 through 16. Although a basic embodiment includes RGB pixels for the visible image capture, other embodiments may use different colored pixel schemes (e.g., Cyan, Magenta and Yellow).

The image sensor 1703 may also include ADC circuitry for digitizing the signals from the image sensor and timing and control circuitry for generating clocking and control signals for the pixel array and the ADC circuitry.

The planar board 1702 may include signal traces to carry digital information provided by the ADC circuitry to the connector 1701 for processing by a higher end component of the host computing system, such as an image signal processing pipeline (e.g., that is integrated on an applications processor).

A camera lens module 1704 is integrated above the RGBZ image sensor 1703. The camera lens module 1704 contains a system of one or more lenses to focus received light to the image sensor 1703. As the camera lens module's reception of visible light may interfere with the reception of IR light by the image sensor's time-of-flight pixel cells, and, contra-wise, as the camera module's reception of IR light may interfere with the reception of visible light by the image sensor's RGB pixel cells, either or both of the image sensor's pixel array and lens module 1703 may contain a system of filters arranged to substantially block IR light that is to be received by RGB pixel cells, and, substantially block visible light that is to be received by time-of-flight pixel cells.

An illuminator 1705 composed of a light source array 1707 beneath an aperture 1706 is also mounted on the planar board 1701. The light source array 1707 may be implemented on a semiconductor chip that is mounted to the planar board 1701. A light source driver is coupled to the light source array to cause it to emit light with a particular intensity and modulated waveform.

In an embodiment, the integrated system 1700 of FIG. 17 supports three modes of operation: 1) 2D mode; 3) 3D mode; and, 3) 2D/3D mode. In the case of 2D mode, the system behaves as a traditional camera. As such, illuminator 1705 is disabled and the image sensor is used to receive visible images through its RGB pixel cells. In the case of 3D mode, the system is capturing time-of-flight depth information of an object in the field of view of the illuminator 1705. As such, the illuminator 1705 is enabled and emitting IR light (e.g., in an on-off-on-off . . . sequence) onto the object. The IR light is reflected from the object, received through the camera lens module 1504 and sensed by the image sensor's Z pixels. In the case of 2D/3D mode, both the 2D and 3D modes described above are concurrently active.

FIG. 18 shows a depiction of an exemplary computing system 1800 such as a personal computing system (e.g., desktop or laptop) or a mobile or handheld computing system such as a tablet device or smartphone. As observed in FIG. 18, the basic computing system may include a central processing unit 1801 (which may include, e.g., a plurality of general purpose processing cores) and a main memory controller 1817 disposed on an applications processor or multi-core processor 1850, system memory 1802, a display 1803 (e.g., touchscreen, flat-panel), a local wired point-to-point link (e.g., USB) interface 1804, various network I/O functions 1805 (such as an Ethernet interface and/or cellular modem subsystem), a wireless local area network (e.g., WiFi) interface 1806, a wireless point-to-point link (e.g., Bluetooth) interface 1807 and a Global Positioning System interface 1808, various sensors 1809_1 through 1809_N, one or more cameras 1810, a battery 1811, a power management control unit 1812, a speaker and microphone 1813 and an audio coder/decoder 1814.

An applications processor or multi-core processor 1850 may include one or more general purpose processing cores 1815 within its CPU 1801, one or more graphical processing units 1816, a main memory controller 1817, an I/O control function 1818 and one or more image signal processor pipelines 1819. The general purpose processing cores 1815 typically execute the operating system and application software of the computing system. The graphics processing units 1816 typically execute graphics intensive functions to, e.g., generate graphics information that is presented on the display 1803. The memory control function 1817 interfaces with the system memory 1802. The image signal processing pipelines 1819 receive image information from the camera and process the raw image information for downstream uses. The power management control unit 1812 generally controls the power consumption of the system 1800.

Each of the touchscreen display 1803, the communication interfaces 1804-1807, the GPS interface 1808, the sensors 1809, the camera 1810, and the speaker/microphone codec 1813, 1814 all can be viewed as various forms of I/O (input and/or output) relative to the overall computing system including, where appropriate, an integrated peripheral device as well (e.g., the one or more cameras 1810). Depending on implementation, various ones of these I/O components may be integrated on the applications processor/multi-core processor 1850 or may be located off the die or outside the package of the applications processor/multi-core processor 1850.

In an embodiment one or more cameras 1810 includes an RGBZ image sensor having an RGBZ unit cell in which the visible light pixel cells share a same storage capacitor and/or in which the RGBZ unit cell includes any of the other features discussed above with respect to FIGS. 4 through 16. Application software, operating system software, device driver software and/or firmware executing on a general purpose CPU core (or other functional block having an instruction execution pipeline to execute program code) of an applications processor or other processor may direct commands to and receive image data from the camera system.

In the case of commands, the commands may include entrance into or exit from any of the 2D, 3D or 2D/3D system states discussed above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
an image sensor comprising a pixel array having a unit cell that includes visible light photodiodes and an infra-red photodiode, the visible light photodiodes and the infra-red photodiode coupled to a particular column of the pixel array, the unit cell having a first capacitor coupled to the visible light photodiodes to store charge from each of the visible-light photodiodes, the unit cell having a readout circuit to provide the first capacitor's voltage on the particular column, the unit cell having a second capacitor that is coupled to the infra-red photodiode through a transfer gate transistor to receive charge from the infra-red photodiode during a time-of-flight exposure, the unit cell comprising a back-drain transistor coupled to the infra-red photodiode.

2. The apparatus of claim 1 wherein the second capacitor is coupled to the readout circuit, the readout circuit to also provide the second capacitor's voltage on the particular column.

3. The apparatus of claim 2 wherein the unit cell comprises a reset transistor that is coupled to both the first and second capacitors to clear respective charge from the first capacitor and the second capacitor.

4. The apparatus of claim 2 wherein the visible light photodiodes are coupled to respective transfer gate transistors and respective back-drain transistors.

5. The apparatus of claim 1 wherein the unit cell comprises a reset transistor that is coupled to both the first and second capacitors to clear respective charge from the first capacitor and the second capacitor.

6. The apparatus of claim 1 wherein the visible light photodiodes are coupled to respective transfer gate transistors and respective back-drain transistors.

7. The apparatus of claim 1 wherein the second capacitor is larger than the first capacitor.

8. The apparatus of claim 1 wherein the unit cell further comprises a second readout circuit coupled to the second capacitor, the second readout circuit to provide the second capacitor's voltage on the particular column.

9. The apparatus of claim 1 wherein the back-drain transistor is coupled to the first capacitor.

10. The apparatus of claim 1 wherein the first capacitor is coupled to the second capacitor through a transistor.

11. A method, comprising:
transferring first charge from a first photodiode that has received visible light of a first type into a storage capacitor and reading out a first voltage of the storage capacitor at a pixel array column;
transferring second charge from a second photodiode that has received visible light of a second type into the storage capacitor and reading out a second voltage of the storage capacitor at the pixel array column;
transferring third charge from a third photodiode that has received visible light of a third type into the storage capacitor and reading out a third voltage of the storage capacitor at the pixel array column; and,
transferring fourth charge from a fourth photodiode that has received infra red light during a time-of-flight exposure into a second storage capacitor and reading out a fourth voltage of the second storage capacitor at the pixel array column.

12. The method of claim 11 further comprising transferring said fourth charge during an exposure time of the fourth photo-diode and performing said transferring of any of said first, second and third charges during said exposure time.

13. The method of claim 11 further comprising transferring said fourth charge during an exposure time of the fourth photo-diode and permitting fifth charge from any of said first, second and third photo-diodes to flow into a supply node during said exposure time.

14. The method of claim 11 further comprising transferring said fourth charge during an exposure time of the fourth photo-diode and performing said reading out of any of said first, second and third voltages during said exposure time.

15. The method of claim 11 further comprising reading out said first, second, third and fourth voltages with a same readout circuit.

16. The method of claim 11 further comprising clearing said first, second and third voltages from said first capacitor and clearing said fourth voltage from said second capacitor with a same reset transistor.

17. A computing system, comprising:
an applications processor having multiple processing cores coupled to a memory controller, said memory controller coupled to a system memory;
a camera system coupled to said applications processor, said camera system comprising an image sensor, said image sensor comprising a pixel array having a unit cell that includes visible light photodiodes and an infra-red photodiode, the visible light photodiodes and the infra-red photodiode coupled to a particular column of the pixel array, the unit cell having a first capacitor coupled to the visible light photodiodes to store charge from each of the visible-light photodiodes, the unit cell having a readout circuit to provide the first capacitor's voltage on the particular column, the unit cell having a second capacitor that is coupled to the infra-red photodiode through a transfer gate transistor to receive charge from the infra-red photodiode during a time-of-flight exposure, the unit cell comprising a back-drain transistor coupled to the infra-red photodiode.

18. The computing system of claim 17 wherein the second capacitor is coupled to the readout circuit, the readout circuit to also provide the second capacitor's voltage on the particular column.

19. The computing system of claim 18 wherein the unit cell comprises a reset transistor that is coupled to both the first and second capacitors to clear respective charge from the first capacitor and the second capacitor.

20. The computing system of claim 18 wherein the visible light photodiodes are coupled to respective transfer gate transistors and respective back-drain transistors.

21. The computing system of claim 17 wherein the unit cell comprises a reset transistor that is coupled to both the first and second capacitors to clear respective charge from the first capacitor and the second capacitor.

22. The computing system of claim 17 wherein the visible light photodiodes are coupled to respective transfer gate transistors and respective back-drain transistors.

23. The computing system of claim 17 wherein the back-drain transistor is coupled to the first capacitor.

24. The computing system of claim 17 wherein the first capacitor is coupled to the second capacitor through a transistor.

25. The computing system of claim 17 wherein the second capacitor is larger than the first capacitor.

* * * * *